(12) United States Patent
Kamenec

(10) Patent No.: US 11,355,307 B1
(45) Date of Patent: Jun. 7, 2022

(54) 3D MAPPING OF SAMPLES IN CHARGED PARTICLE MICROSCOPY

(71) Applicant: FEI Company, Hillsboro, OR (US)

(72) Inventor: Jaroslav Kamenec, Ivancice (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/115,660

(22) Filed: Dec. 8, 2020

(51) Int. Cl.
*H01J 37/22* (2006.01)
*H01J 37/244* (2006.01)
*H01J 37/18* (2006.01)
*H01J 37/20* (2006.01)
*H01J 37/26* (2006.01)

(52) U.S. Cl.
CPC ............ *H01J 37/222* (2013.01); *H01J 37/18* (2013.01); *H01J 37/20* (2013.01); *H01J 37/244* (2013.01); *H01J 37/261* (2013.01); *H01J 2237/04928* (2013.01)

(58) Field of Classification Search
CPC .......... H01J 37/222; H01J 37/18; H01J 37/20; H01J 37/244; H01J 37/261; H01J 2237/04928
See application file for complete search history.

(56) References Cited

U.S. PATENT DOCUMENTS

| | | | |
|---|---|---|---|
| 7,371,786 B2 * | 5/2008 | Yoshihara ................ | C09D 4/06 523/205 |
| 8,487,252 B2 | 7/2013 | Diemer et al. | |
| 10,488,434 B2 * | 11/2019 | Godec-Schonbacher ................... | G01Q 60/38 |
| 10,754,141 B2 * | 8/2020 | Allier ................... | G02B 21/362 |
| 10,890,749 B2 * | 1/2021 | Futami ................ | G02B 21/368 |
| 11,189,012 B2 * | 11/2021 | Betz ..................... | G01B 11/005 |
| 11,217,422 B2 * | 1/2022 | Nemoto ............... | H01J 37/226 |
| 2014/0313312 A1 | 10/2014 | Gaiduk et al. | |
| 2019/0103245 A1 | 4/2019 | Van Der Mast et al. | |
| 2019/0353886 A1 | 11/2019 | Iliopoulos et al. | |
| 2020/0251302 A1 | 8/2020 | Nemoto et al. | |

FOREIGN PATENT DOCUMENTS

JP 2018-017969 2/2018

* cited by examiner

*Primary Examiner* — David A Vanore
(74) *Attorney, Agent, or Firm* — Klarquist Sparkman, LLP

(57) ABSTRACT

Situating samples on an optical axis of a charged particle microscope can be performed based a 3D map of the samples. The 3D map is produced with back-side illumination of the samples and telecentric imaging to produce profile images. The profile images are a combined to form the 3D map. Using the 3D map, the processor is coupled to a sample stage to situate a selected sample or sample portion for imaging in the charged particle microscope. In some examples, the processor is responsive to selection of a sample using a graphical interface so that the sample stage is controlled to safely situate the selected sample without further operator intervention.

20 Claims, 23 Drawing Sheets

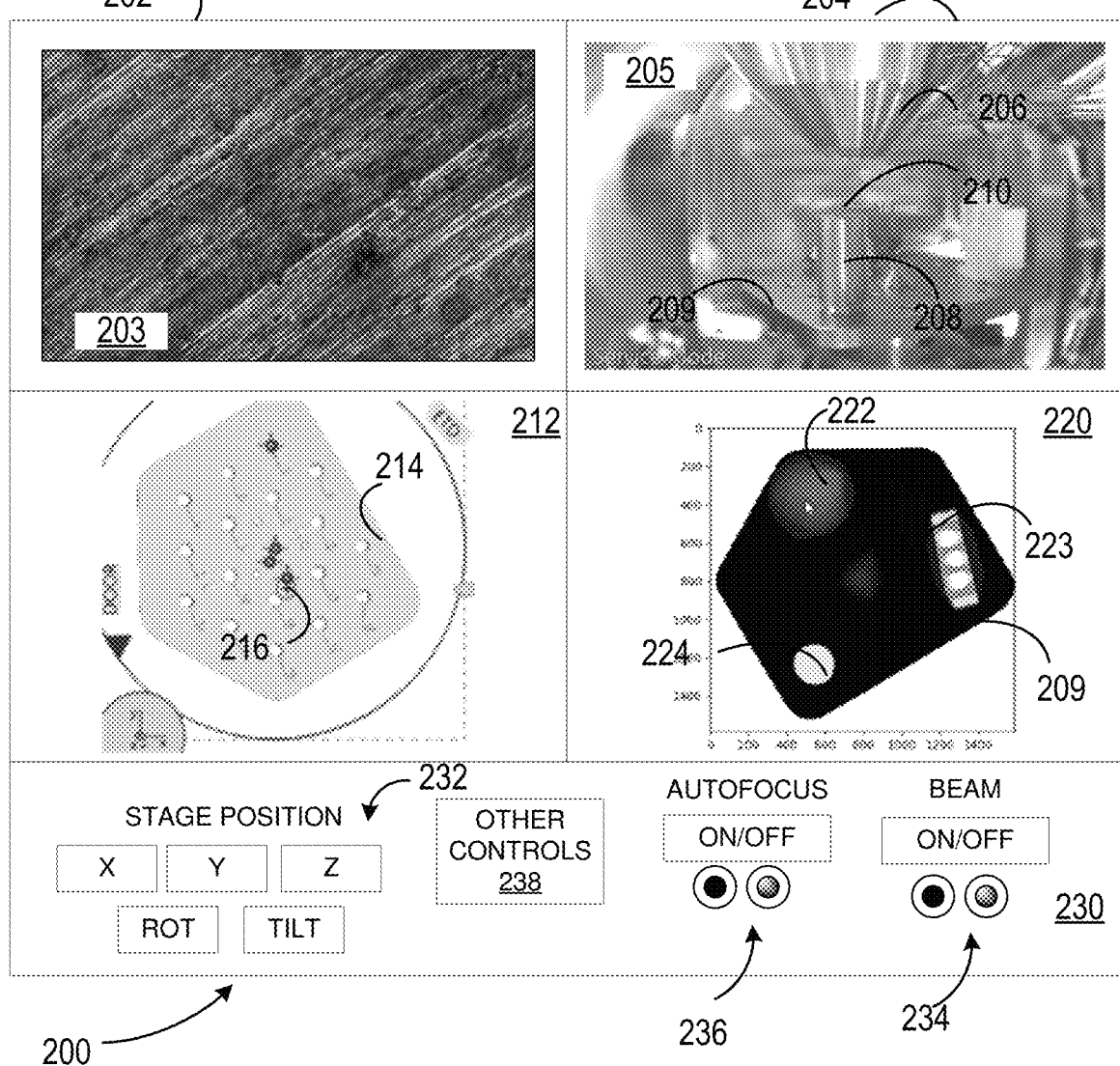

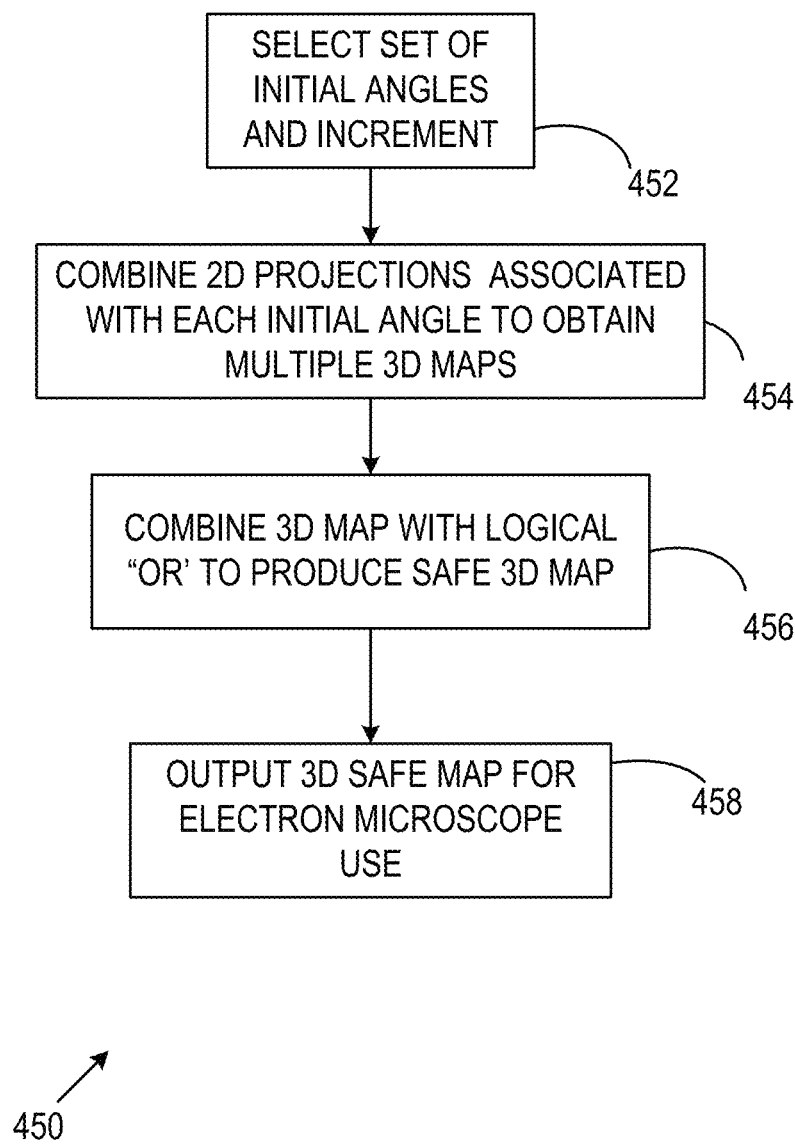

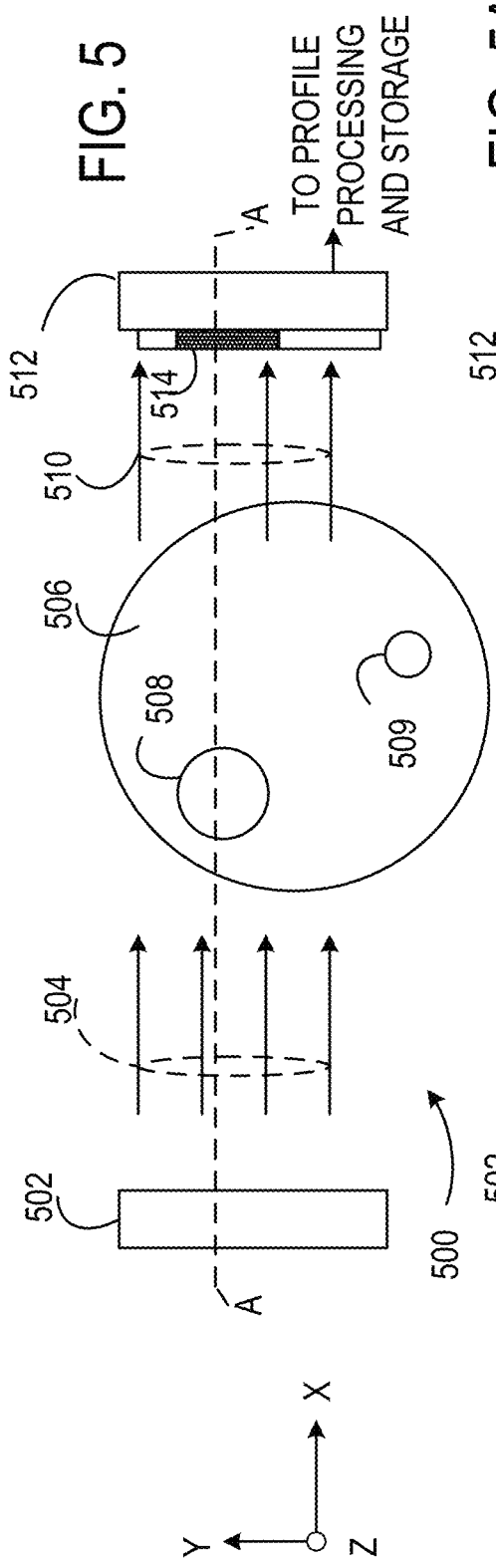
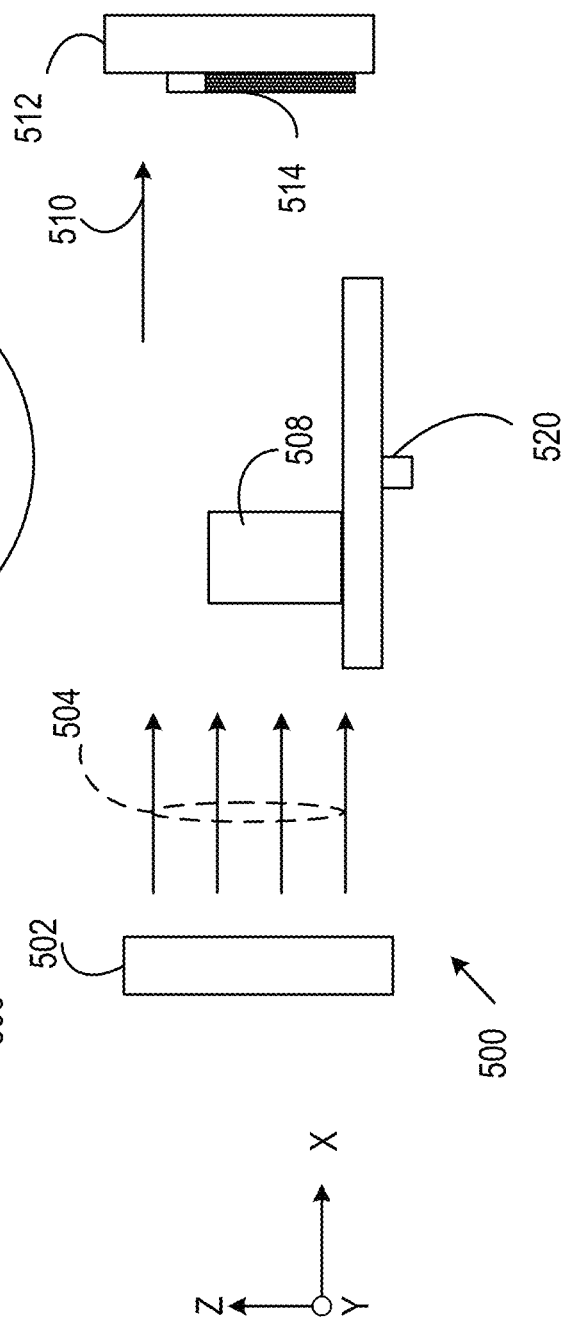

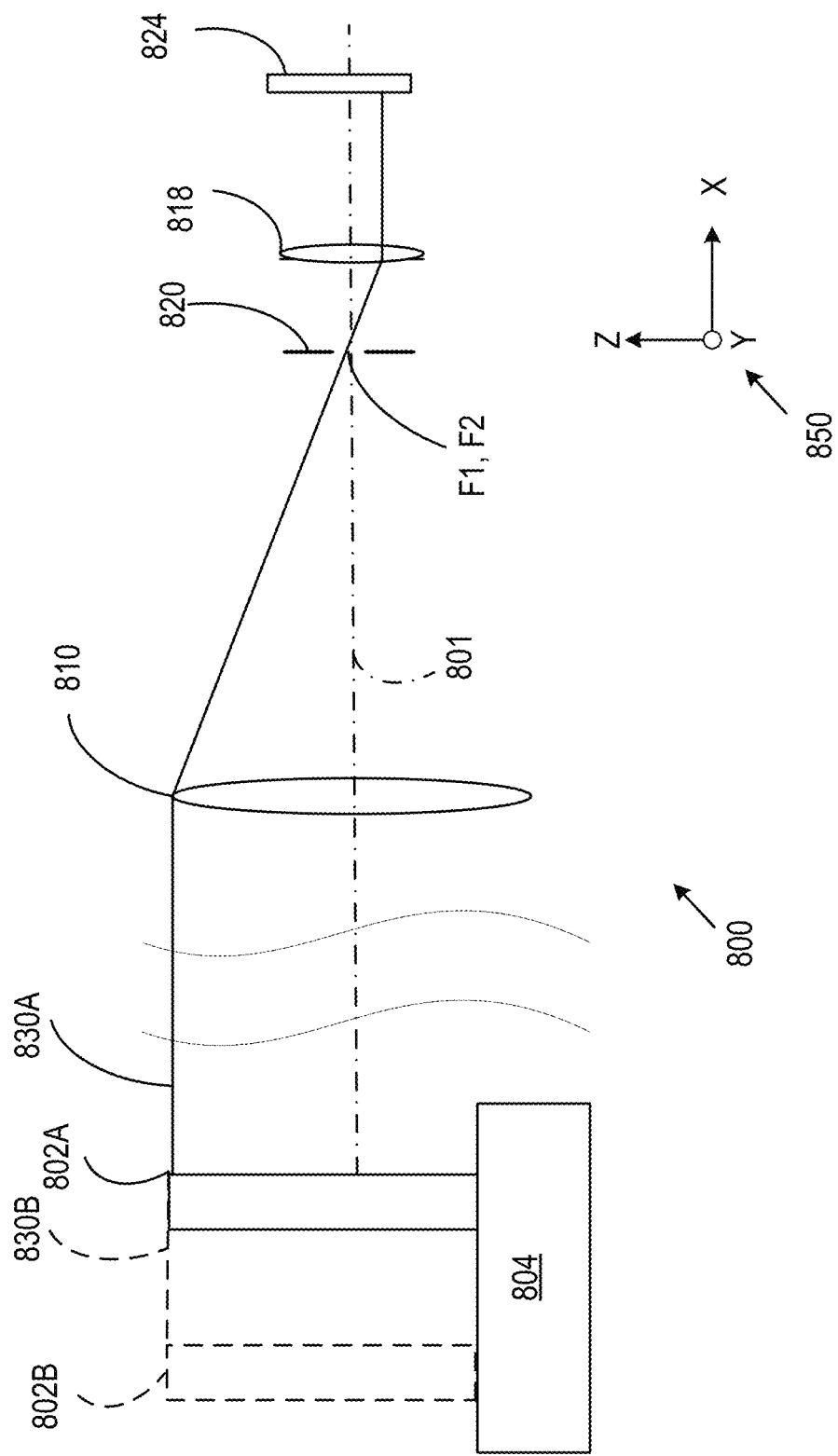

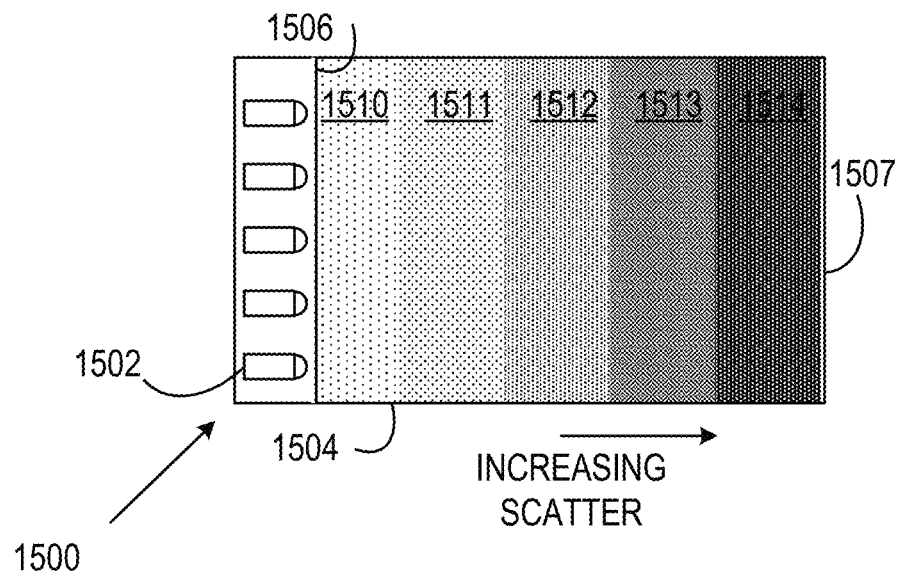
FIG. 15
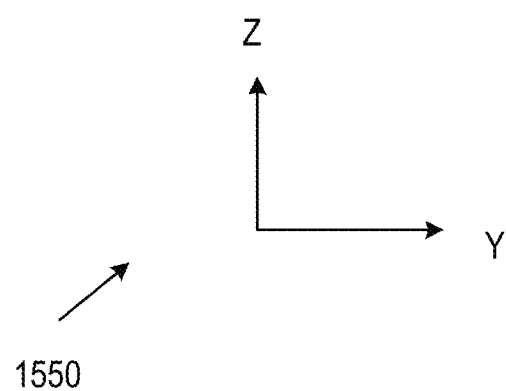

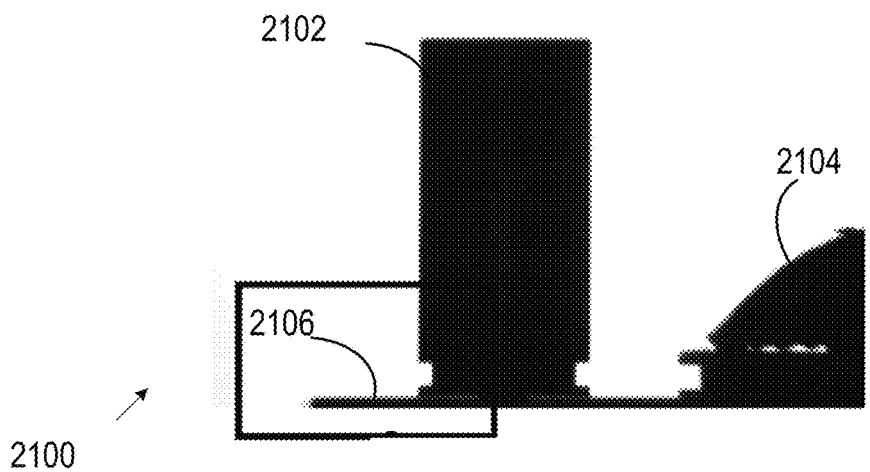
FIG. 21A
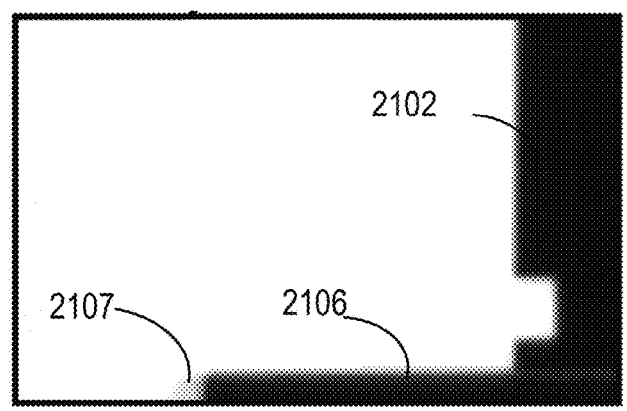
FIG. 21B
FIG. 22A 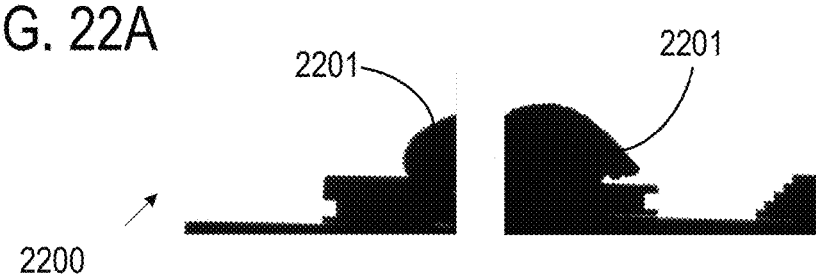 FIG. 22B
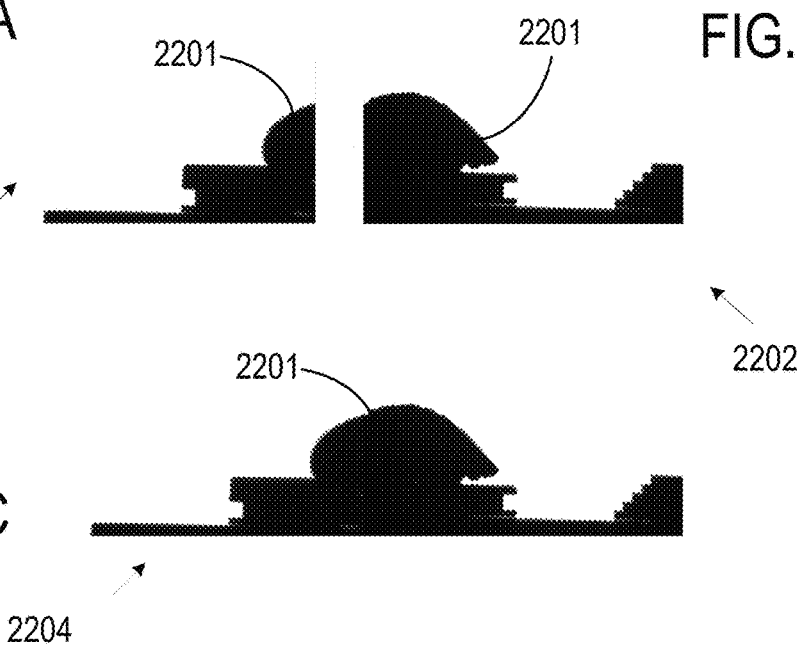
FIG. 22C

3D MAPPING OF SAMPLES IN CHARGED PARTICLE MICROSCOPY

FIELD

The disclosure pertains to methods and systems for microscopy, and more particularly, to positioning sample in a charged particle microscope.

BACKGROUND

Positioning samples for electron microscopy can be time-intensive and requires operator diligence. Variably-sized samples on a sample holder must be carefully positioned to avoid contact with microscope components such a pole pieces used by magnetic lenses, electron detectors, or other components. In some cases, a sample holder retains multiple samples of differing heights and an operator must move each sample carefully into the microscope field of view. After positioning in the field of view, additional operator time is then required to focus the sample. Sample positioning and focusing thus are both time consuming and prone to error, and the operator skill needed can require supervision of new users who can cause sample/pole piece contact, introducing astigmatism, misalignment, or component or sample damage. For at least these reasons, alternative approaches are needed.

SUMMARY

Methods comprise illuminating a sample situated within a vacuum chamber of a charged-particle microscope from a first side and detecting at least one 2D projection of the sample on a second side, opposite the first side. A 3D map is generated based on the at least one 2D projection and the sample is situated at an imaging location within the vacuum chamber based on the 3D map. In some examples, the first side is opposite the second side and a plurality of 2D projections of the sample on the second side are detected and the 3D map is generated based on the plurality of projections. Typically, the plurality of 2D projections of the sample on the second side are detected by rotating the sample. In some examples, a set of 3D maps is produced, each 3D map based on a set of rotation angles, wherein the 3D map is based on combining each of the set of 3D maps. In examples, the sample is moved into the imaging location after the 2D projections are detected. In further examples, the sample is loaded into a vacuum chamber of a charged particle microscope and irradiated with light. The sample is moved into the imaging location within the vacuum chamber based on a 3D map generated from the 2D projection. The sample may be processed or imaged with the charged particle beam at the imaging location. In some examples, illuminating the sample comprises directing a collimated beam to the sample and the collimated beam is directing along an axis that is perpendicular to a charged-particle optical axis. The illuminating the sample can be performed with a light source situated within or outside of the vacuum chamber. In some alternatives, illuminating the sample comprises illuminating the sample with beam having a patterned intensity, and further comprising identifying reflective sample surface based on the patterned intensity. In some examples, detecting at least one 2D projection of the sample on the second side, opposite the first side is performed with a telecentric optical system. The telecentric optical system can include an objective lens that is situated within or outside of the vacuum chamber. The telecentric optical system is one or both of object-side telecentric and image-side telecentric. In some examples, the central axis of the detector for acquiring the 2D projections is parallel to the sample platform for holding the samples.

A charged particle microscope comprises an illumination system situated to illuminate samples from a first side and an imaging system situated to produce 2D profiles of the illuminated samples based on the illumination from the first side. A processor is coupled to receive the 2D profiles and generate a 3D map based on the 2D profiles. The imaging system includes an image sensor situated to produce the 2D profile images of the illuminated samples based on the illumination from the first side;

and the processor is coupled to a sample stage and is configured to rotate the illuminated samples to produce the 2D profiles. The imaging system can include a telecentric optical system that directs 2D profiles to the image sensor. The illumination system can be situated to direct a diffuse beam to the samples or a collimated beam to the samples. A sample stage is operable to move the sample platform to a charged particle optical axis.

The foregoing and other features, and advantages of the disclosed technology will become more apparent from the following detailed description, which proceeds with reference to the accompanying figures.

BRIEF DESCRIPTION OF THE DRAWINGS

FIG. 2 illustrates a representative graphical user interface for focusing a charged particle microscope at selected location.

FIG. 4C illustrates a representative method of making a "safer" 3D map.

FIG. 5 illustrates a representative optical system for surface profiling using collimated illumination.

FIG. 5A is a sectional view of the optical system of FIG. 5.

FIG. 8 illustrates a representative optical system for surface profiling using a telecentric optical system.

FIG. 15 illustrates a representative graded-intensity illuminator.

FIG. 21A illustrates a 2D projection having a reflective area.

FIG. 21B illustrates the portion of FIG. 21A that includes the reflective area.

FIGS. 22A-22B are partial 2D projections.

FIG. 22C is a full 2D projection obtained by combining the 2D projections of FIGS. 22A-22B.

DETAILED DESCRIPTION

In the following, representative examples of CPB systems such as CPB microscopes and related components, subcomponents, and methods are disclosed. In many practical examples, electron beams are of interest, and the examples are described with reference electron beams for convenient illustration. The disclosed approaches can also be used in light microscopy as well. In most examples, additional CPB components such as lenses, deflectors, stigmators, and additional apertures are used, but are not shown for convenient illustration. The disclosed methods and apparatus can be used in both transmission and scanning microscopy. As discussed below, in some examples, a vacuum chamber can be evacuated while one or more samples are profiled at a sample profiling location to produce a 3D map. The samples can be situated on a stage at a charged particle (CP) optical axis or can be tilted with respect to or displaced from the CP optical axis. The samples may be moved to the CP optical axis for imaging or processing after profiled. As used herein, image can refer to a presentation of image data on a display for visual inspection by an operator or data associated with visual image such as stored in a JPG, TIFF, or other data file. As used herein, X and Y refer to axes that are orthogonal to a CP optical axis (a Z-axis). Such axes need not be mutually orthogonal, but orthogonal axes are convenient.

Illumination as used herein refers generally to directing electromagnetic radiation to an object or the electromagnetic radiation itself. Such electromagnetic radiation is typically visible light at wavelengths between about 400 nm and 700 nm which are convenient for use with readily available image sensors and permit operator observation as well as use with a camera. Other wavelengths can also be used, but the range 300 nm to about 2 µm is convenient. In the examples, back-illumination is generally used. Front illumination produces profile images that are generally dependent on sample reflectivity and details of the samples. By contrast, back illumination produces profile images with contrast between light and dark areas (unblocked and blocked areas) that generally depend on sample shape and not sample surface characteristics. Back illumination can be provided by placing a light source behind an object of interest or placing a reflector behind the object and reflecting light to the object.

Terms such as profile, projection, profile image, and projection image are used to refer to a sample outline produced as a shadow or as an image using an optical system. In some cases, these term refer to a distribution of illumination directed to an image sensor or to an associated detected illumination distribution.

Lenses are shown in the examples as single element lenses but multi-element lenses can also be used. Light optical systems are shown typically along a linear axis, but such an axis can be bent or folded using prisms or mirrors, as desired.

Example 1

Figure 1:
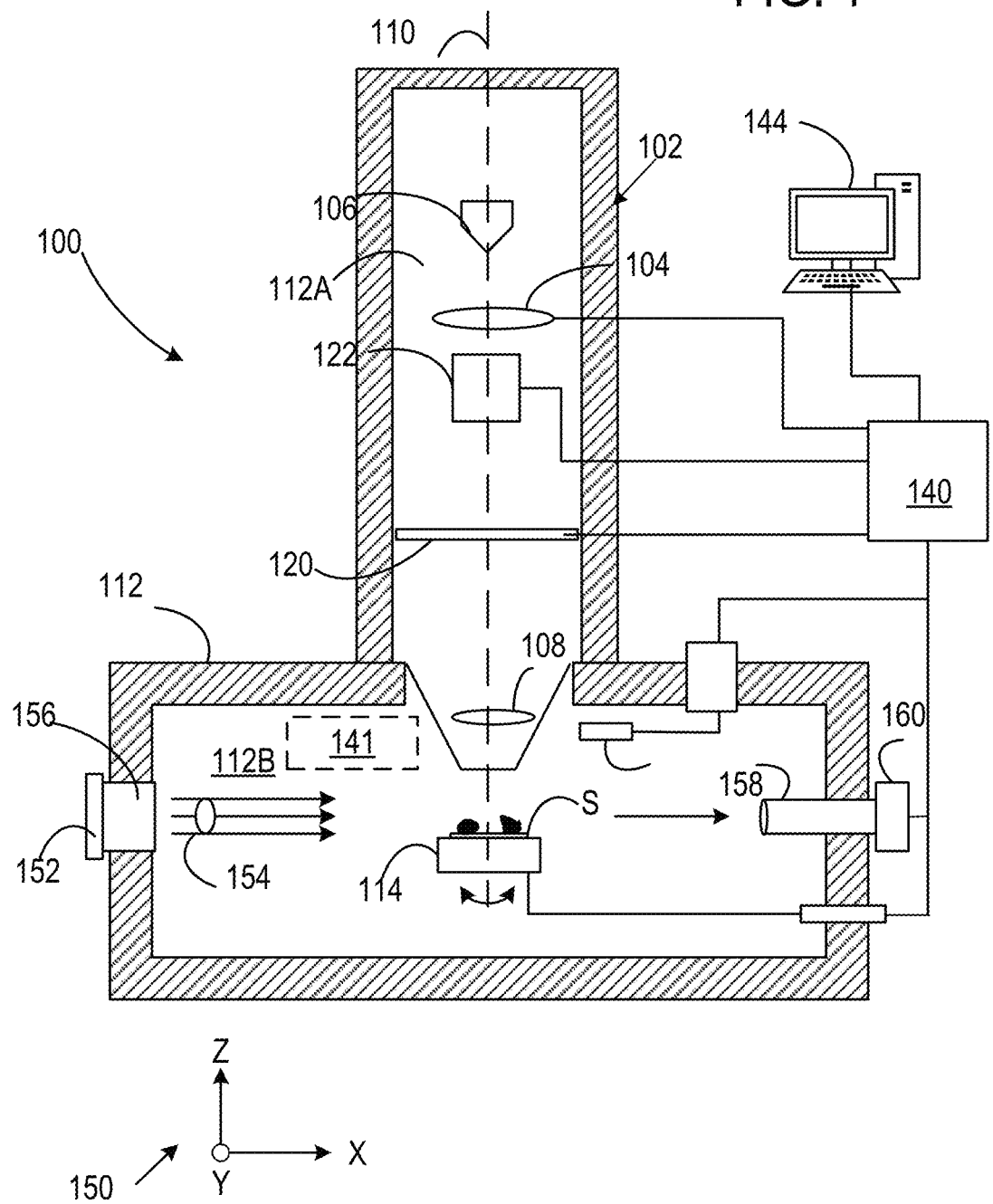
FIG. 1 illustrates a representative charged particle microscope that includes a surface profiling optical system.

Referring now to FIG. 1, in a representative embodiment, a charged particle beam (CPB) system 100 includes a CPB microscope 102 such as a scanning electron microscope (SEM) or a transmission electron microscope (TEM) and comprises one or more CPB lenses such as a condenser lens 104 that is situated to direct a CPB from a CPB source 106 towards an objective lens 108. The CPB source 106 can be, for example, a field emitter that produces an electron beam, but other sources can be used. In some embodiments, one or more additional CPB lenses can be provided, and can be magnetic lenses and/or electrostatic lenses. A primary axis 110 may be determined during manufacturing of the microscopy system. In use, the CPB propagates along the primary axis 110 towards a sample stage 114 and a beam deflector 122 can be used to scan the beam with respect to samples S situated on a sample stage 114. The sample stage 114 generally provides translations and or rotations for positioning the samples S. Typically, the samples S are secured to a sample platform that is then secured to the sample stage 114.

Figure 13:
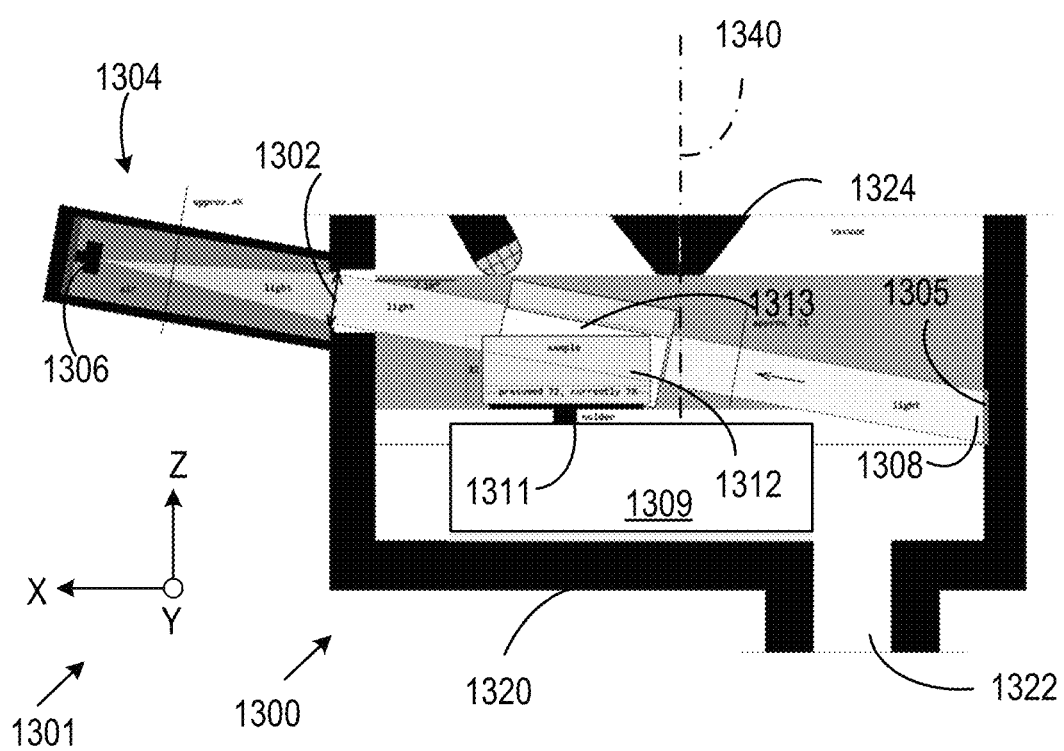
FIG. 13 illustrates a portion of a charged-particle microscope having a tiltable sample platform.

The CPB system 100 includes a vacuum chamber housing 112 that can be evacuated using vacuum pumps (not shown) and typically defines a first volume 112A that contains the CPB source 106 and selected other CPB optical components and a second volume 112B that is situated to receive the sample S and the sample stage 114. A column isolation valve (CIV) 120 is situated to separate the first volume 112A and the second volume 112B. Typically, the CIV 120 is operable to hermetically isolate the first volume 112A from the second volume 112B during sample exchange. The sample stage 114 can be movable in an X-Y plane as shown with respect to a coordinate system 150, wherein a Y-axis is perpendicular to a plane of the drawing. The sample stage 114 can further move vertically (along a Z-axis) to compensate for variations in the height of the samples S and to aid in focusing the beam at the samples S. The sample stage 114 can also rotate about an axis parallel to the z-axis as well as tilt the sample S. In some cases, sample profiling is done with the sample platform tilted as shown in FIG. 13, discussed further below. In some embodiments, the CPB microscope 102 can be arranged vertically above the sample S and can be used to image the samples. In some embodiments, the CPB microscope 102 can be arranged vertically above the sample S and can be used to image the samples S while an ion beam machines or otherwise processes the samples S.

A light source 152 is situated to deliver an illumination beam 154 through a window 156 in the vacuum chamber housing 112. The illumination beam 154 is illustrated as a collimated beam but can be diffuse or uncollimated as well. An optical system comprising one or more lenses such as lens 158 is situated to receive portions of the illumination beam 154 that are not blocked by the samples S and produce one or more profile images (or 2D projections) of the samples S at or near an image sensor 160. As shown, the lens 158 and portions of the optical system extend into the vacuum chamber 112. However, either the optical system, the light source 152, or both can be inside, outside, or partially inside and outside of the vacuum chamber housing 112. Typically, the sample stage 114 is rotated about the axis 110 (or a parallel axis) and profile images acquired during the rotation. For example, the sample stage 114 can be rotated 360 degrees and profile images acquired at 1 degree intervals.

The CPB system 100 can further comprise a computer processing apparatus 144 such as a control computer and a CPB system controller 140 for controlling beam deflectors, CPB lenses 104, 108 and other CPB lenses and other components such as detectors and the sample stage 114, including rotations and translations of the sample stage 114. The computer processing apparatus 144 can also control display of information gathered from or more CPB detectors on a display unit. In some cases, the computer processing apparatus 144 (e.g., the control computer) establishes various excitations, records image data, and generally controls operation of the CPB microscope 102 including the control of profile image acquisition. A so-called "navigational camera" 137 is situated to provide top-down images of the sample and the sample stage, typically for viewing by an operator. A camera 141 can also be provided to obtain a side view of samples. The camera 141 is typically displaced along the Y-axis (into the plane of FIG. 1) and is situated to view out of the plane of FIG. 1.

The sample stage 114 can be translated along the Z-axis for focusing as controlled by one or both of the computer processing apparatus 144 and the CPB system controller 140 based on the profile images produce with the image sensor 160. In some examples, the sample stage 114 can be set to a suitable Z-axis location for imaging a particular sample with or without manual operator adjustment of Z-axis position. Sample imaging can be based on transmitted, reflected, or scattered charged particles, X-rays or other electromagnetic radiation, or secondary emission received by one or more detectors that are not shown in FIG. 1.

Example 2

FIG. 2 illustrates a portion of a graphical user interface 200 that can be provided on a display device associated with a CPB system such as illustrated in FIG. 1. In this example, a display area 202 contains an image of a substrate surface, display area 204 is a side view 205 of an electron microscope column that includes a pole piece 206 and a sample 208 that is secured to a sample platform 209 and having a surface 210 whose image is shown in the display area 202. The side view 205 may be obtained using an optical system and an image sensor such as the lens 158 and image sensor 160 of FIG. 1 or any of the optical systems described below. Display area 212 illustrates a top surface 214 of the sample platform 209 indicating a location 216 for which beam focus is selected. Display area 220 contains a top view of the sample platform 209 on which various samples can 222-224 be seen. A display area 230 includes display areas for stage X, Y, Z, rotation, and tilt coordinates 232, an area 234 used to indicated with a computer pointing device that a CPB is to be turned on (shown as radio buttons), an area 236 used to indicated with a computer pointing device that a autofocus is to be activated for the area indicated at 216, and an area 238 that can include other controls and data. With this user interface, indicating that the location 216 is to be imaged using a computer pointing device causes the sample stage to position the location suitably with respect to the electron microscope optical column based on profile data that permits safe movement (i.e., collision free movement).

Example 3

Figure 3B:
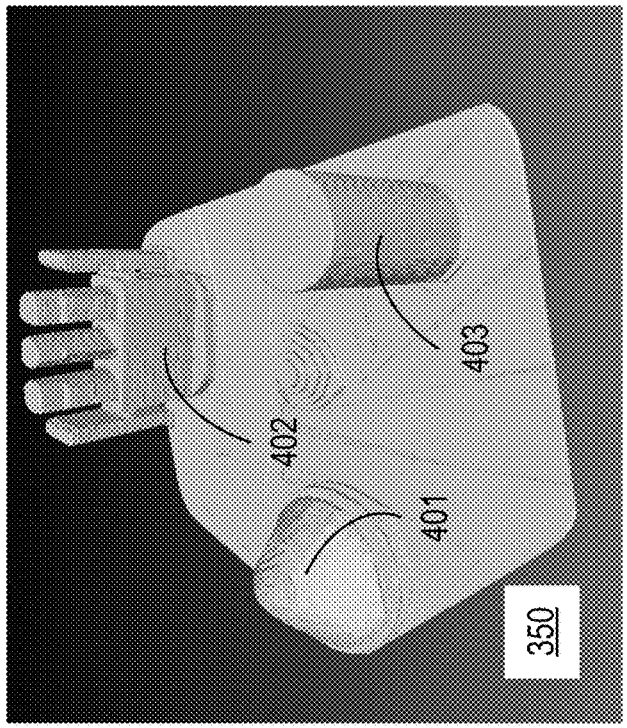
FIG. 3B is a 3D map corresponding to FIG. 3A.
Figure 3A:
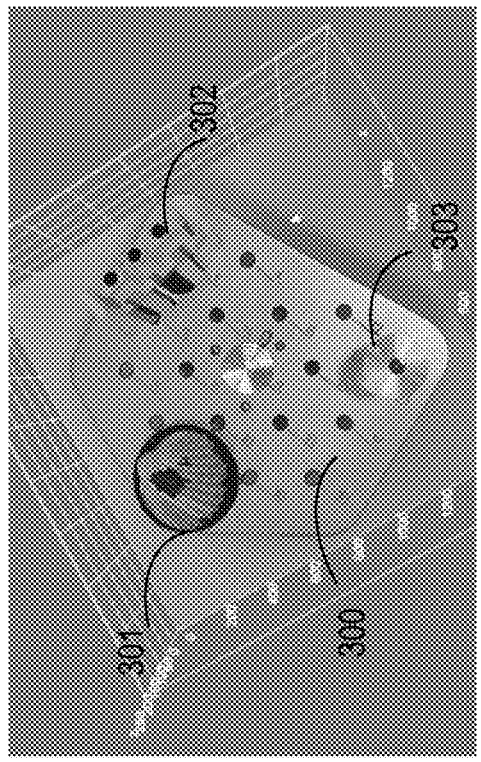
FIG. 3A is a representation of samples situated on a sample platform.

FIG. 3A illustrates a representative plan view of a sample platform to which samples 301-303 are secured. FIG. 3A is captured with a navigational camera, such as the navigational camera 137 of FIG. 1. 3D coordinate axes are provided for convenience. Based on plurality of profile images (profiles) obtained as discussed a 3D map 350 is produced in FIG. 3B. The 3D map includes map regions 401-403 corresponding to the samples 301-303 shown in FIG. 3A. Images from cameras such as the cameras 137, 141 of FIG. 1 can be combined with the 3D map for visualization, but the 3D map does not require such camera images.

Example 4

Figure 4B:
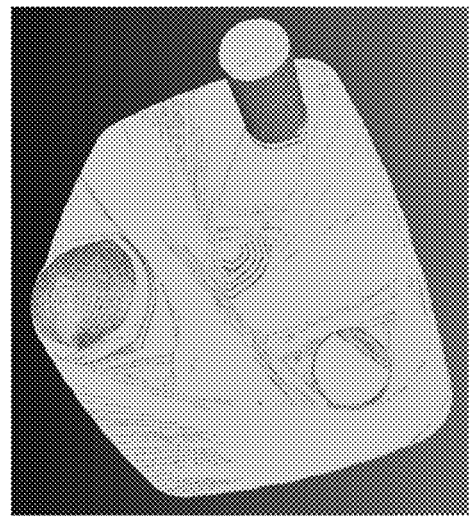
FIGS. 4A-4B illustrate representative 3D maps of samples such as those shown in FIG. 3B.
Figure 4A:
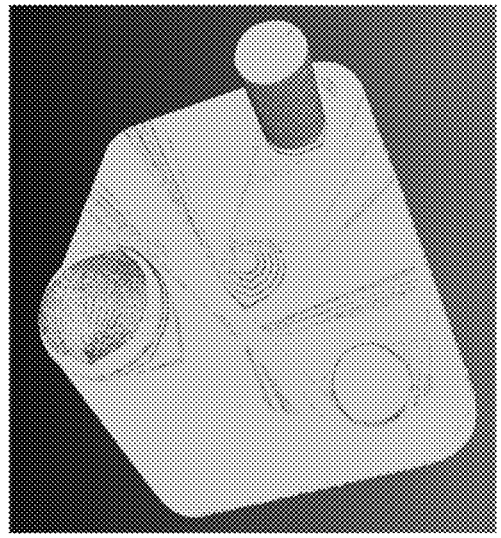

Typically, multiple 2D projections or profiles of the sample platform and the samples are obtained with a plurality of sample platform rotations of about 1 degree through a range of 360 degrees. In some cases (such as in the presence of reflections from sample surface in profiles), a series of rotations at a first increment (such as 6 degrees) through a 360 degree range beginning at a first angle is used to obtain a first 3D map. The first angle is then incremented at a second increment and the 360 degree range is spanned by additional profiles at the first increment. Thus, multiple series of 2D profiles can be obtained such as at 0, 6, 12, . . . , 360 degrees to produce a first 3D map, then, the at 1, 7, 13, . . . to produce a second 3D map, etc. This can produce 6 3D maps, each associated with 60 rotation angles. Each of these maps can show reflections that are not shown on the other maps. These maps can be combined, preferably using an OR operation so that any reflective surfaces of a sample are included in mapping This tends to produce a "safe" 3D map for focus adjustment and the stage holder can be moved without the sample contacting other components. As used herein, safe 3D map refers to a 3D map obtained by accounting for reflections. FIG. 4A shows a 3D map produced with 360 rotations incremented by 1 degree. FIG. 4B shows a 3D map produced by combining 6 3D maps produced with 60 incremented rotations. The 1 degree incremented mapping is better for visualizing the samples but the combined 6 degree incremented mapping is safer for sample movements as reflective surfaces are included as possible obstructions.

One approach to providing safe 3D maps is to combine 3D maps obtained at different angles such as differing initial angles with a fixed angular increment. As shown in FIG. 4C, a representative method 450 includes selecting a set of initial angles and an angular increment at 452. At 454, 2D projections associated with each initial angle at multiples of the angular increment are combined to produce multiple 3D maps. For example, for initial angles $\theta_i$ of a set of n initial angles $\theta_1, \ldots, \theta_n$, and an angular increment $\Delta\theta$, 2D projections corresponding to $\theta_i + j\Delta\theta$ for all integer values of j that provide angles within a full rotation are combined for each initial angle to produce n 3D maps. At 456, the 3D maps can be processed with a logical OR within angular range corresponding to the angular increment $\Delta\theta$ to obtain a safe 3D map. For example, five 3D maps made with the angular increment $\Delta\theta=5$ degrees can be obtained using 2D projections made at 1 degree increments. A first 3D map can contain values for 62, 67, 72, and 77 degrees (and other angles over a full 360 degrees), a second 3D can contain values for 63, 68, 73, and 78 (and other angles over a full 360 degrees, and so on. These 3D maps can be combined, i.e., map values within the angular increment Δθ are processed to retain the values corresponding to obstructions (unilluminated region of the sensor). In typical 3D maps with back illumination, 3D map values are either 0 or 1 (unobstructed or obstructed, respectively) and the 3D maps are combined through a logical OR operation. Some 3D maps show obstructions that are not in other maps, and such a combination of 3D maps provides a safe 3D map in which reflections do not result in missing real obstructions. The resulting safe 3D map can be a lower resolution map, but generally does not appear too visually different from a higher resolution 3D map as shown in FIGS. 4A-4B. Different sets of angles can be used to obtain the multiple 3D maps, and the disclosed example is chosen for convenient explanation. Choices of the angle over which map values are combined need not be the same as the angular increment. Typically, 2D projections are obtained at a predetermined angular resolution and then combined to make multiple 3D maps for use in making a safe 3D map. At 458, the 3D safe map is output for use in an electron microscope.

Example 5

FIG. 5 is a plan view and FIG. 5A is a sectional view along A-A of a representative profile measurement system 500 that includes a light source 502 that is configured to produce a collimated beam 504 that is directed to a sample platform 506 on which representative samples 508, 509 are situated. A transmitted beam portion 510 is directed to an image sensor 512 to produce a 2D profile image. As shown, a portion of the collimated beam 504 is blocked by the sample 508 and produces a corresponding dark or shaded area 514 at the image sensor 512. The sample platform is rotated about an axis 520 so that the light and dark areas on the image sensor change and different profile images are obtained. The samples 508, 509 are moved into and out the beam 504 during the rotation.

Example 6

Figure 6:
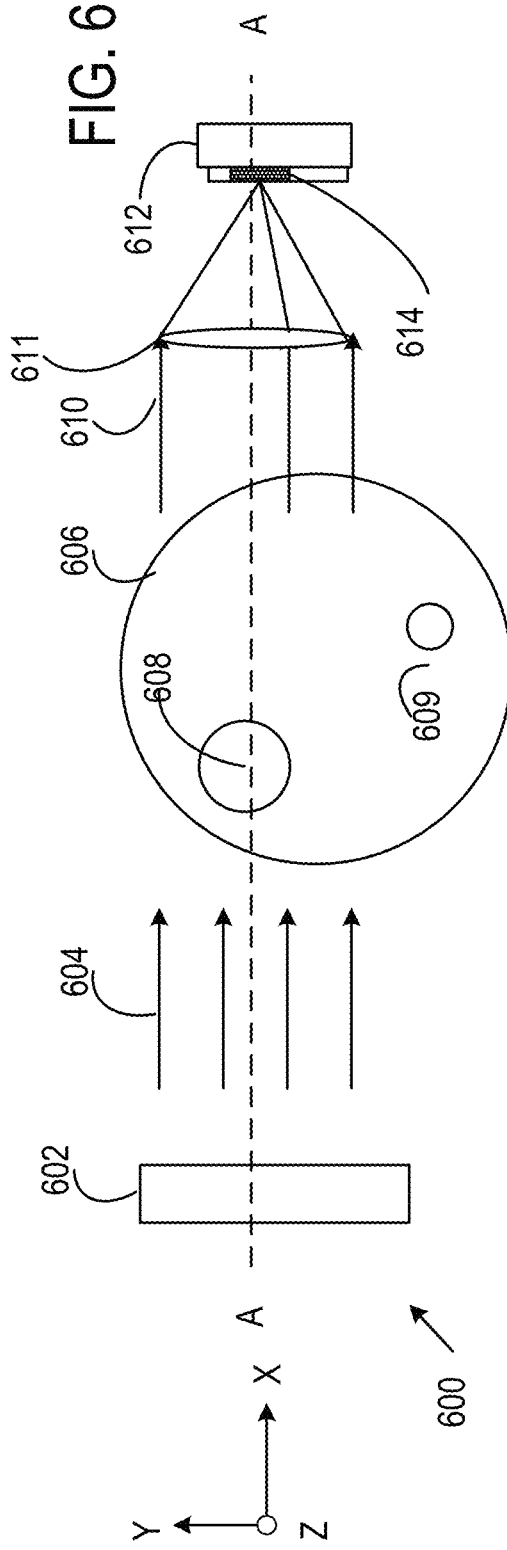
FIG. 6 illustrates a representative optical system for surface profiling using a telecentric optical system.
Figure 6A:
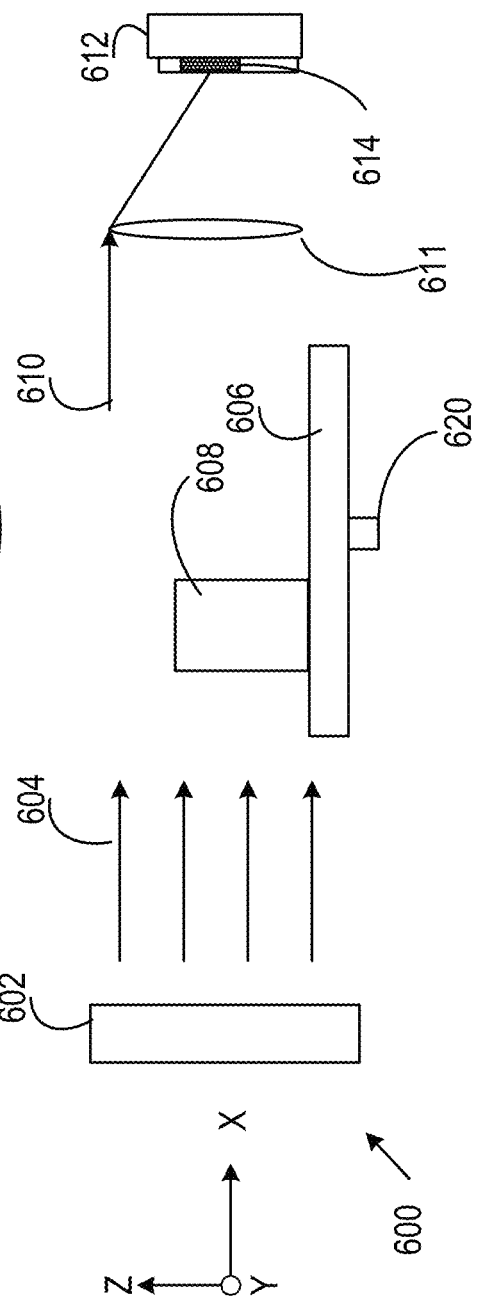
FIG. 6A is a sectional view of the optical system of FIG. 6.

FIG. 6 is a plan view and FIG. 6A is a sectional view of a representative profile measurement system 600 that includes a light source 602 that is configured to produce a beam 604 that is directed to a sample platform 606 on which representative samples 608, 609 are situated. A transmitted beam portion 610 is directed to an image sensor 612 via a telecentric optical system 611 (shown as a single lens for purposes of illustration) to produce a 2D profile image. As shown, a portion of the beam 604 is blocked by the sample 608 and produces a corresponding dark or shaded area 614 at the image sensor 612. The sample platform is rotated about an axis 620 so that the light and dark areas on the image sensor change, and the samples 608, 609 move with respect the image sensor 612. In this example, the light source 602 is shown as producing a collimated beam but diffuse beams or diverging beams can be used. Collimation is not required as the telecentric optical system 611 eliminates or reduces perspective errors as discussed in detail below. While diverging or diffuse beams can be used, such beams may produce reflections from sample surfaces that can be overlooked and inappropriately considered as unobstructed areas.

Example 7

Figure 7:
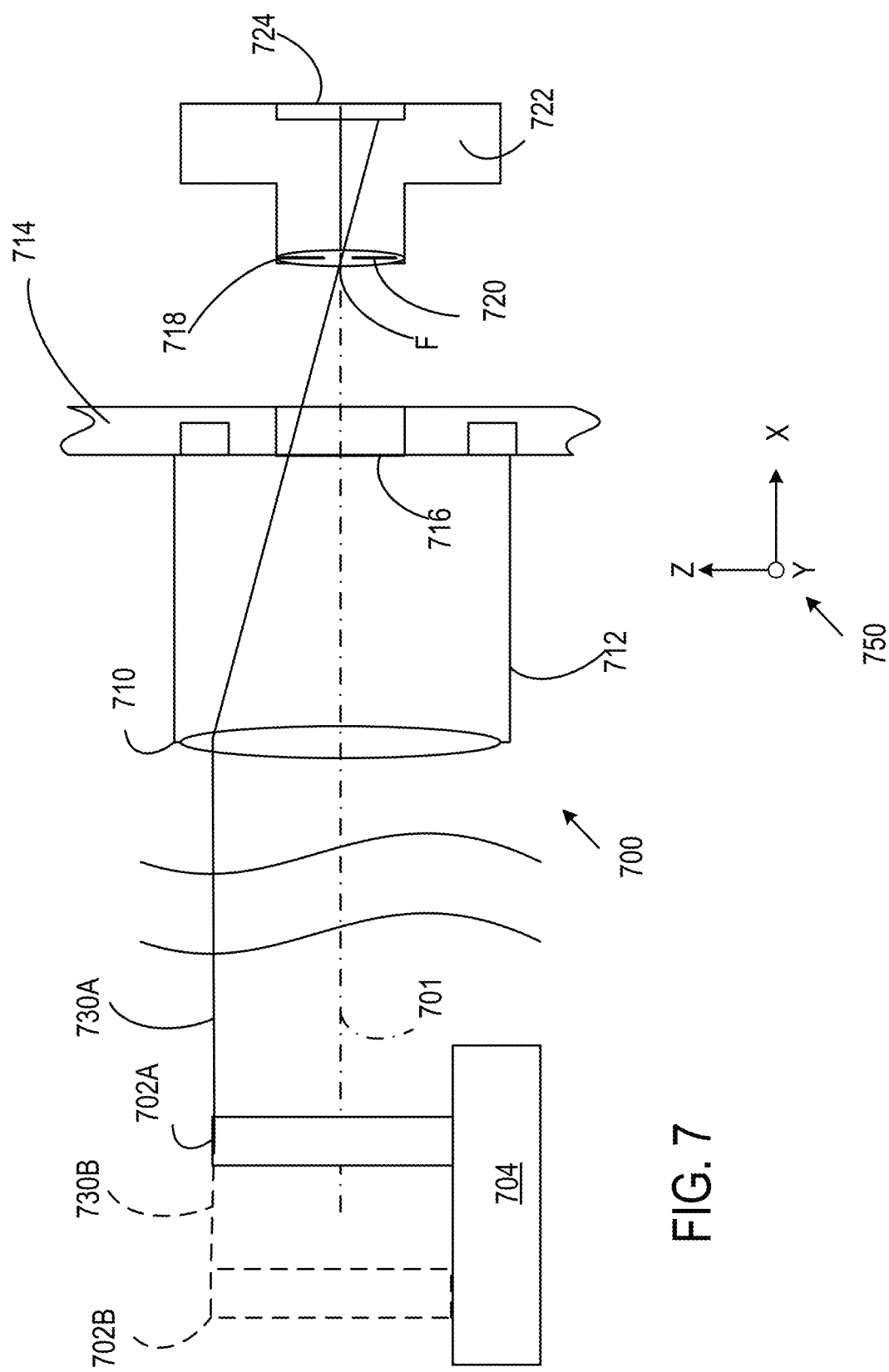
FIG. 7 illustrates a representative optical system for surface profiling using a telecentric optical system.

FIG. 7 illustrates a portion of representative profile measurement system that includes a telecentric optical system 700 situated to produce an image of a sample that can be situated at various locations along an optical system axis 701 such as at 702A, 702B. The sample is secured to a rotatable sample platform 704 so that sample position along both X- and Y-axes of a representative coordinate system 750 can vary. For convenience, the optical system axis 701 is shown as parallel to the X-axis and an electron microscope axis is parallel to the Z-axis. The telecentric optical system includes an objective lens 710 that is mounted within a vacuum chamber. The objective lens 710 is fixed to a lens tube 712 that is secured to a vacuum chamber wall 714 at an optical window 716. An imaging lens 718 and an aperture stop 720 are situated at the focal length F of the objective lens 710 to obtain telecentricity. As shown, the imaging lens 718 and the aperture stop 720 are included in a camera 722 that also includes an image sensor 724 and associated electronics for acquiring, processing, storing, and communicating images. In this example, the optical system can be referred to as object-side telecentric as chief rays are parallel on the object-side of the optical system.

With this telecentric arrangement, the apparent size of a sample does not vary with distance to the optical system and magnification is the same for all object distances. A sample that is out of focus will have a blurry image but the size of the blurry image corresponds to that of an in-focus image of the sample. Sample edges can appear blurred, but can be readily located. Parallax errors are avoided. In some examples, all samples are in focus due to the available focal depth of field. Placement of the aperture stop at the focus of the lens is a representative approach to achieving telecentricity. As shown in FIG. 7, with the sample situated at either 702A or 702B, associated chief rays 730A, 730B, respectively, pass through the center of the aperture stop 720. For clarity of illustration, image formation by the imaging lens 718 is not shown so that chief rays can be readily seen. As discussed above, some or all portions of the telecentric optical system 700 can be inside or outside of a vacuum chamber as may be convenient.

In the arrangement of FIG. 7, the specimen can be illuminated either from the front side or the back side. In typical examples, back side illumination is used so that samples block illumination and images of samples are shown as dark regions with edges. Using mirrors or other reflectors, front or back side illumination can be provided with sources located on either the front side or the back side of a sample. Side illumination can also be used, but typical requires processing to properly identify reflective areas for a safe 3D map.

Example 8

FIG. 8 illustrates a portion of representative profile measurement system that includes a telecentric optical system 800 situated to produce an image of a sample that can be situated at various locations along an optical system axis 801 such as at 802A, 802B. The sample is secured to a rotatable sample platform 804 so that sample position along both X- and Y-axes of a representative coordinate system 850 can vary. For convenience, the optical system axis 801 is shown as parallel to the X-axis and an electron microscope axis is parallel to the Z-axis. The telecentric optical system includes an objective lens 810 and an imaging lens 818 that are situated about an aperture stop 820 located at the respective focal lengths F1, F2 of the objective lens 810 and the imaging lens 818 to obtain telecentricity and produce an image at an image sensor 824. Associated electronics for acquiring, processing, storing, and communicating images are not shown. In this example, the optical system can be referred to as object-side telecentric and image-side telecentric as chief rays are parallel on the object-side and the image-side of the optical system.

With this telecentric arrangement, the apparent size of a sample does not vary with distance to the optical system and magnification is the same for all object distances due to object-side telecentricity. With image-side telecentricity, chief ray position at the image sensor does not depend on object distance and magnification is constant. As shown in FIG. 8, with the sample situated at either 802A or 802B, associated chief rays 830A, 830B, respectively, pass through the center of the aperture stop 820 and are parallel on the image-side of the imaging lens 818. As above, for clarity of illustration, image formation by the imaging lens 818 is not shown so that chief rays can be readily seen. Some or all portions of the telecentric optical system 800 can be inside or outside of a vacuum chamber as may be convenient. In addition, the specimen can be illuminated either from the front side or the back side. In typical examples, back side illumination is used so that samples block illumination and images of samples are shown as dark regions with edges.

Example 9

Figure 9A:
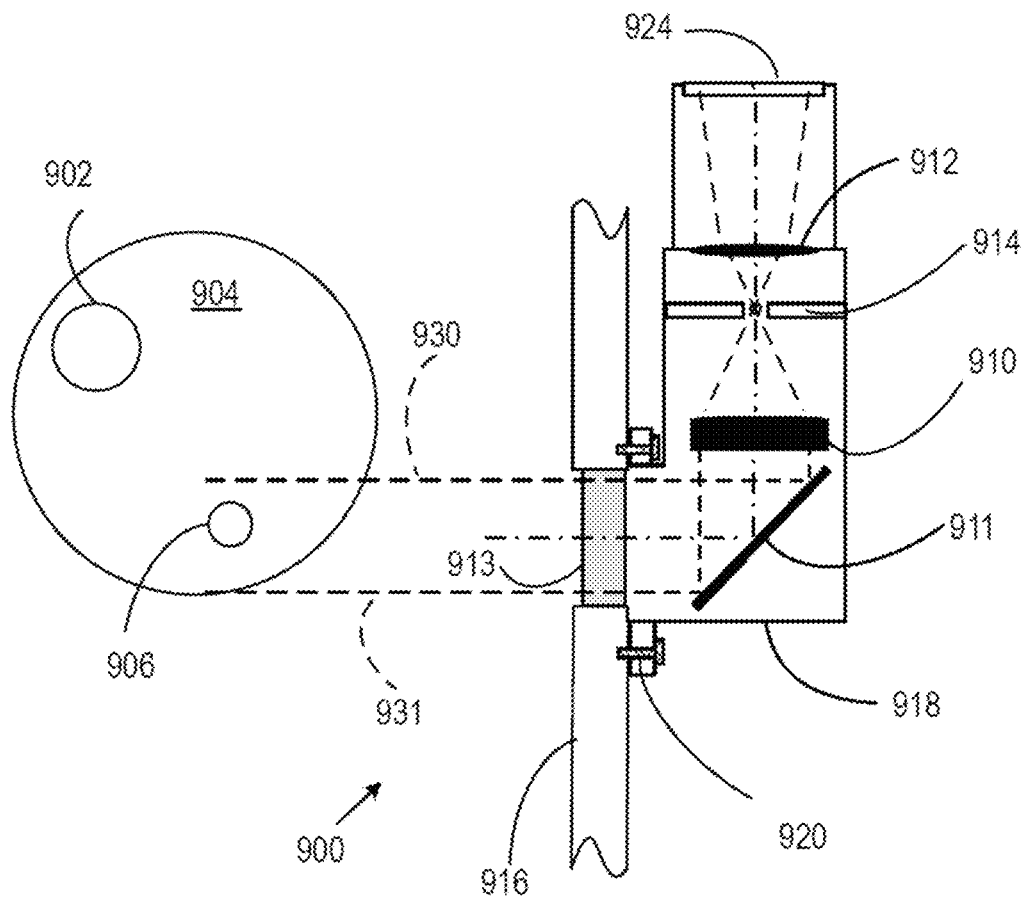
FIGS. 9A-10 illustrate additional representative telecentric optical systems as secured to a wall of a vacuum chamber.

Referring to FIG. 9A, a representative profile system 900 includes an objective lens 910 and an imaging lens 912 situated about an aperture stop 914 to form sample profile images at an image sensor 924. The aperture stop 914 is situated at a focus of the objective lens 910 so that the lenses 910, 912 form an object-side telecentric optical system. The telecentric objective 910 is separated from the vacuum chamber 916 by a vacuum sealed transparent window 913. The imaging lens 912, the aperture stop 914, and the objective lens 910 are secured in a lens tube 918 that is secured to the vacuum chamber 916 with one or more bolts 920 or other fasteners. The lens tube is bent to save a space outside of the vacuum chamber 916. For this purpose, a mirror 911 redirects the beams from the vacuum chamber 916 to the telecentric objective 910.

Rotatable sample stage 904 retains samples 902, 906 with the sample 906 shown positioned in an imaging field of view of the objective lens 910. Representative chief rays 930, 931 are shown, but ray paths associated with image formation by the imaging lens 912 are not shown.

Figure 9B:
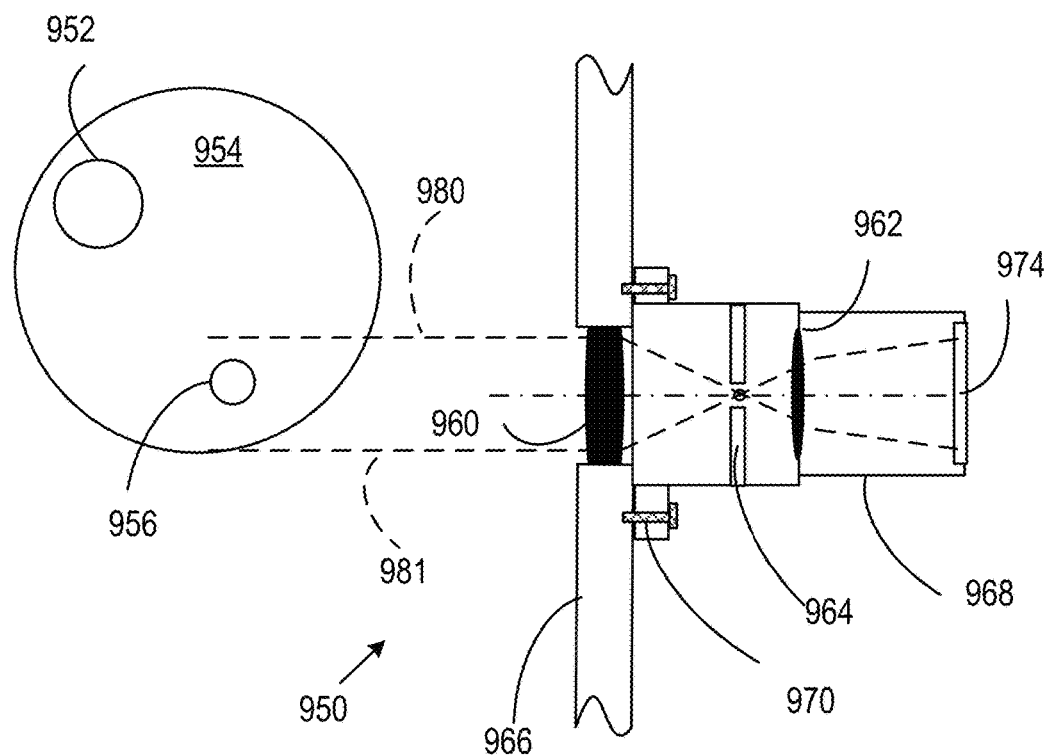

Referring to FIG. 9B, a representative profile system 950 includes an objective lens 960 and an imaging lens 962 situated about an aperture stop 964. The aperture stop 964 is situated at a focus of the objective lens 960 so that the lenses 960, 962 form an object-side telecentric optical system. The objective lens 960 serves as a window in a vacuum chamber 966. The imaging lens 962 and the aperture stop 964 are secured in a lens tube 968 that is secured to the vacuum chamber 966 with one or more bolts 970 or other fasteners. Gaskets or other components needed to ensure a vacuum seal are not shown. A rotatable sample stage 954 retains samples 952, 956 with the sample 956 shown positioned in an imaging field of view of the objective lens 960. Representative chief rays 980, 981 are shown, but ray paths associated with image formation by the imaging lens 962 are not shown.

Example 10

Figure 10:
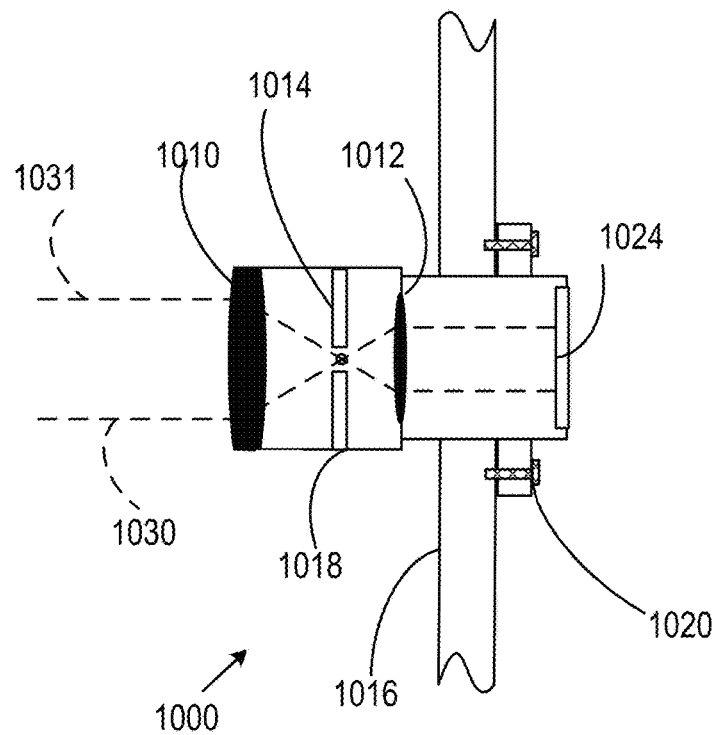

Referring to FIG. 10, a representative profile system 1000 includes an objective lens 1010 and an imaging lens 1012 situated about an aperture stop 1014 to form sample profile images at an image sensor 1024. The aperture stop 1014 is situated at a focus of the objective lens 1010 and a focus of the imaging lens 1012 so that the lenses 1010, 1012 form an object-side and image-side telecentric optical system. The objective lens 1010 and the aperture stop 1014 are situated in a vacuum chamber and are retained by a lens tube 1018 that extends through a wall 1016 of the vacuum chamber. The lens tube 1018 is secured to the vacuum chamber wall 1016 with one or more bolts 1020 or other fasteners. Gaskets or other components needed to ensure a vacuum seal are not shown.

Example 11

Figure 11:
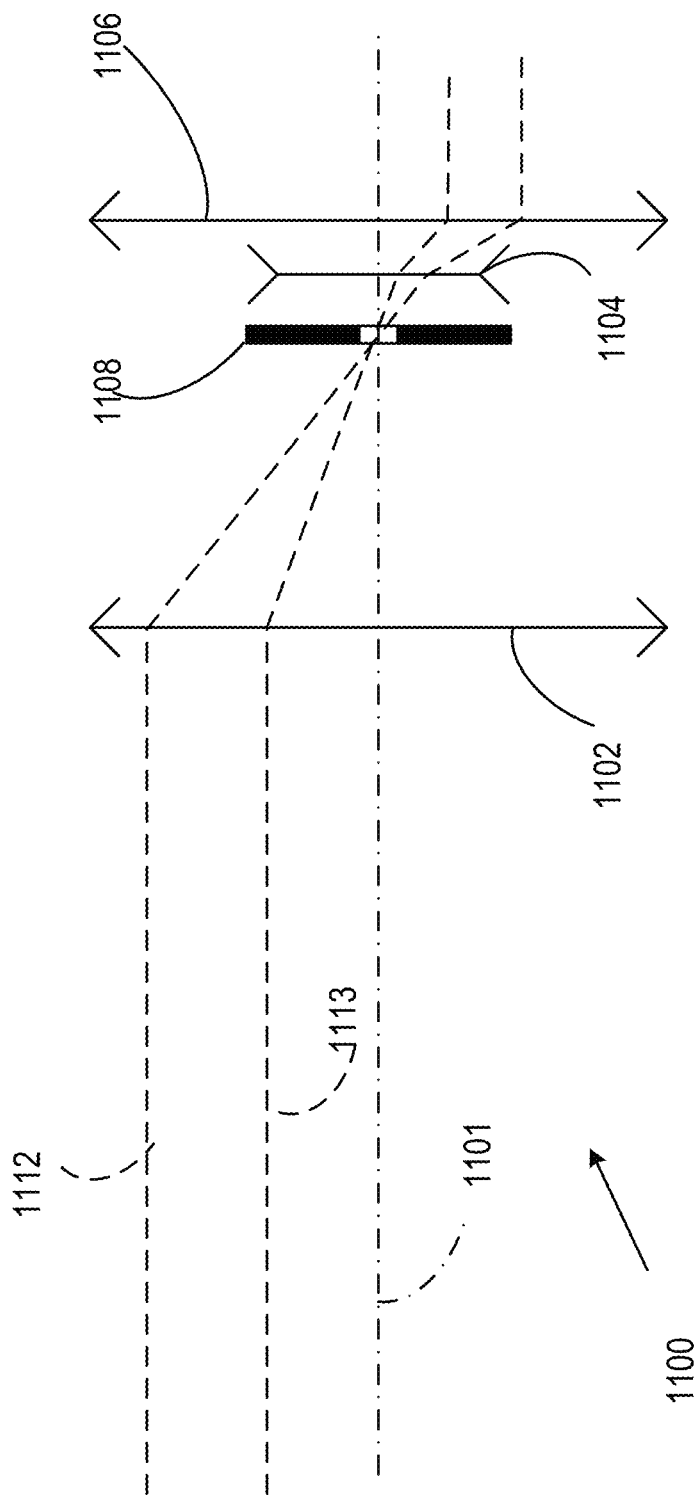
FIG. 11 illustrates a representative telecentric optical that is object-side and image-side telecentric.

Referring to FIG. 11, another representative telecentric optical system 1100 includes an objective lens 1112, an intermediate lens 1004, and an imaging lens 1106 situated on an axis 1101. An aperture stop 1108 is located at the focus of the objective lens 1102 and located with respect to the lenses 1104, 1106 to achieve object-side and image-side telecentricity. In this example, three lenses are used, one of which (the intermediate lens 1004) has negative optical power. Chief rays 1112, 1113 are shown.

Example 12

Figure 12:
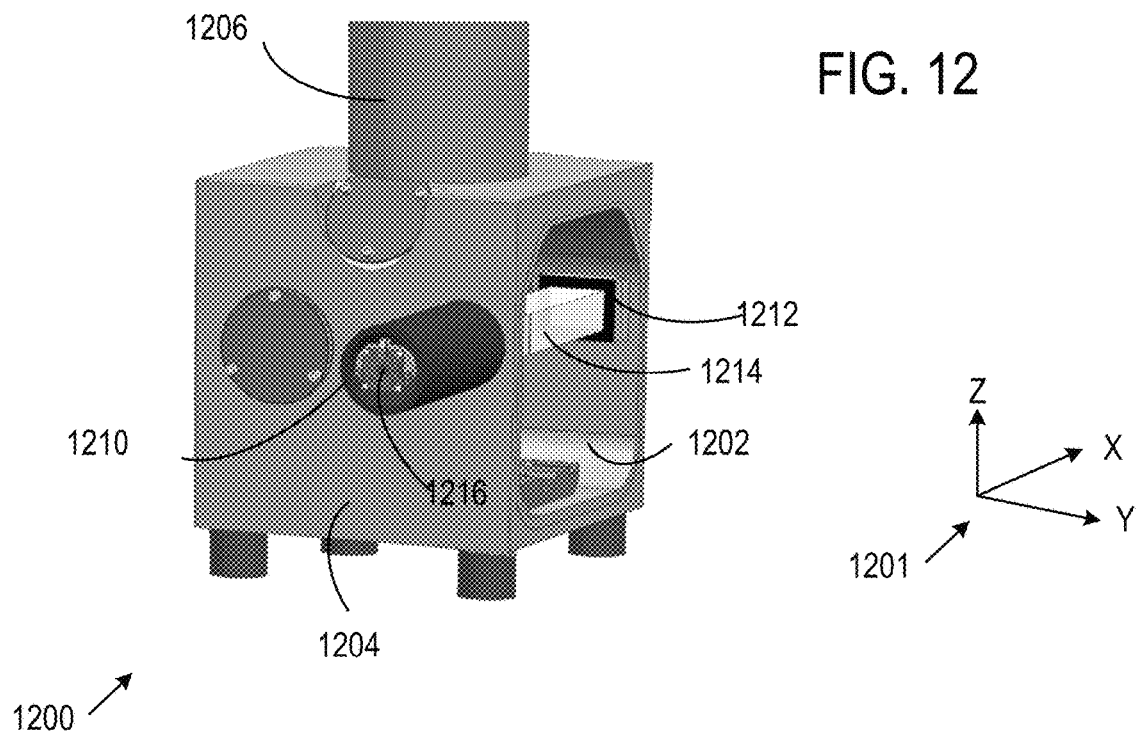
FIG. 12 illustrates a portion of a charged-particle microscope.
Figure 12A:
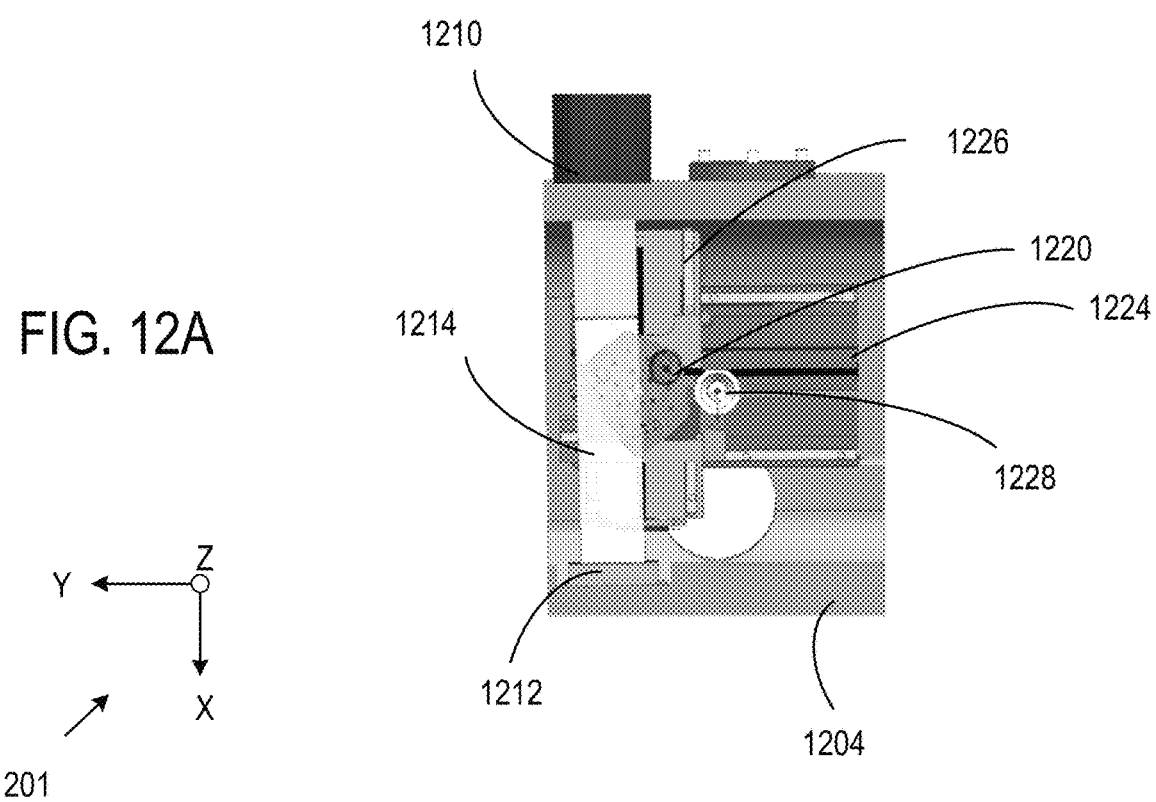
FIG. 12A is a sectional view of the charged-particle microscope shown in FIG. 12.

Referring to FIGS. 12-12A, a portion 1200 of an electron microscope includes a sample chamber 1202 defined by a vacuum chamber 1204. An electron optical system extends along a column 1206, but is not shown further. Sample profiles are obtained using an illuminator 1212 that directs an illumination beam 1214 toward samples secured to a rotatable sample platform 1220 that is translatable along X- and Y-axes of a coordinate system 1201 with translation stages 1226, 1224, respectively. An approximate center 1228 of the electron optical system is displaced from the illumination beam 1214. Samples can be profiled with the illumination beam 1214 and then translated an imaging location, such as the center 1228, to be imaged or processed with the electron optical system. The illumination beam 1214 can be a collimated or diffuse beam and is shown as a rectangular shape for convenient illustration.

Figure 12B:
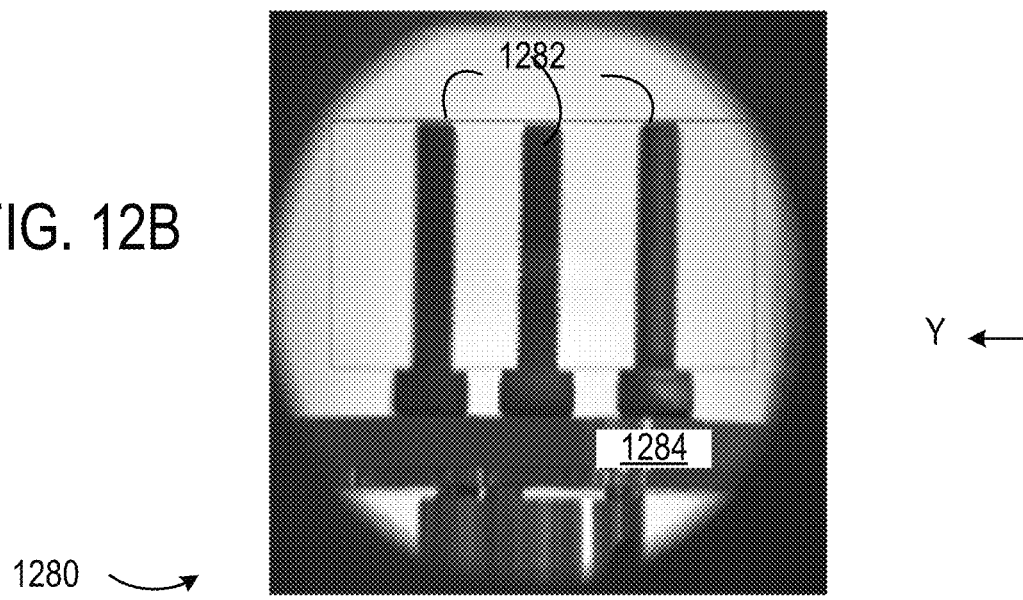
FIG. 12B illustrates a representative 2D profile that can be obtained with an optical system as shown in FIGS. 12-12A.

FIG. 12B is an image 1280 that illustrates a 2D profile obtained with a telecentric optical system for three objects 1282 of the same size situated on a sample platform 1284 at different distances from the telecentric optical system. As shown, the three objects 182 have profiles that are of the same size so that their profiles can be used to provide guidance for safe sample stage movements and focusing.

Example 13

Referring to FIG. 13, a portion 1300 of an electron microscope includes a sample chamber defined by a vacuum chamber 1320 that can be evacuated through a passage 1322. An electron optical system includes an objective lens pole piece 1324 but is not shown further. 2D sample profiles are obtained using an illuminator 1306 that directs an illumination beam 1308 toward samples 1312 secured to a rotatable sample platform 1308 that is translatable along any of the axis of a coordinate system 1301 and tiltable into a sample position 1313 for profiling. The sample platform 1311 is typically coupled to a sample stage 1309 for translation of samples to an axis 1340 of the electron optical system. Samples can be tilted, profiled as displaced and tilted, and then translated with the tilt removed to be imaged with the electron optical system. The illumination beam 1308 can be a collimated or diffuse beam. An objective lens 1302 is situated at the wall of the vacuum chamber 1320 and a camera 1305 is situated to form a telecentric optical system and record sample profiles. The central axis of the profile system 1304 is parallel to the sample platform plane during profiling.

Example 14

Figure 14A:
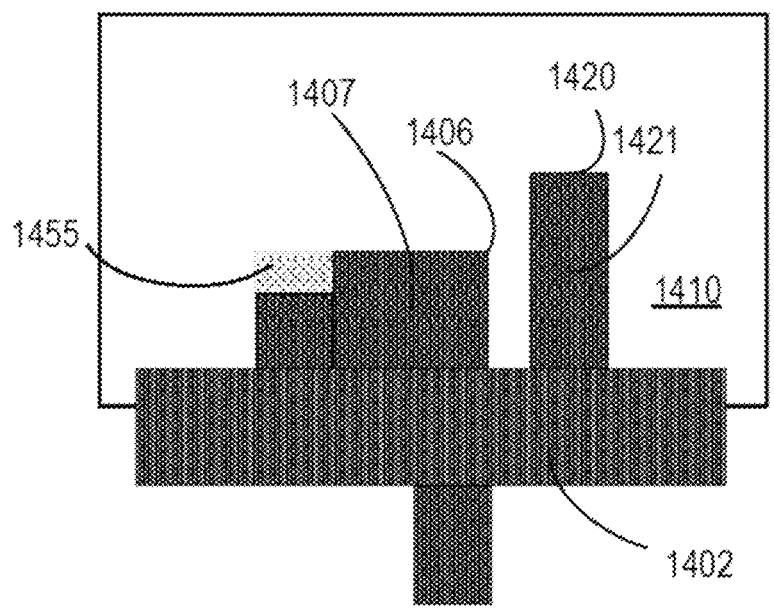
FIGS. 14A-14B illustrate samples having reflective profile portions.

FIG. 14A illustrates aspects of sample profile images. In typical examples, samples such as samples 1406, 1420 are secured to a sample platform 1402 and back-illuminated with an illumination system 1410. The outlines of the samples generally appear dark due to the backside illumination such as sample area 1407, but some portions such as sample area 1455 appear to be brighter because of sample reflexivity and a surface sample tilt. This sample area 1455 reflects light from the illumination system 1410. In order to position samples safely (without collision with components in the electron optical system or other components), intermediate areas such as the sample area 1455 can be processed in the same manner as dark areas such as 1407, 1421. Processing is simple if areas such as the sample area 1455 were appeared darker, but they are still recognizable as possible obstructions to be avoided in moving samples into position for imaging.

Figure 14B:
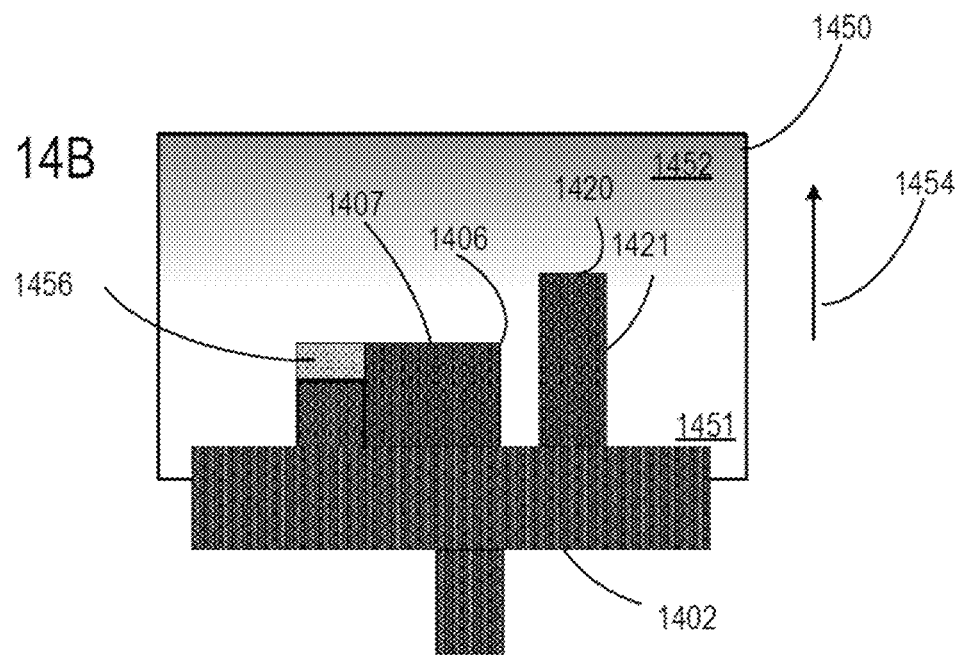

FIG. 14B illustrates the sample arrangement of FIG. 14A but using an illuminator 1450 that provides variable illumination in a Z-axis direction 1454. As shown, the illuminator 1450 includes a relatively bright area (higher intensity) 1451 and relatively dark area (lower intensity) 1452 that produces a relatively darker area 1456—if used with the illumination system 1410 of FIG. 14A, the area 1456 would appear brighter in the 2D profile and be more difficult to recognize as a possible obstruction. Reflection from the area 1456 is associated with sample surface reflexivity and a surface sample tilt. By varying the illumination intensity in the z-direction, the top portion of the samples may be imaged with higher contrast, and therefore identified with higher accuracy in a 3D map. Other stepped or gradual increases or decreases in illumination intensity along Z-axis can be used and provided for by suitable numbers of light emitters, variations in light scattering, or light attenuation, or other approaches. Because obstructions should appear dark, reflective obstructions such as sides of a sample can appear relatively bright in comparison with obstructions that completely block illumination. These relatively bright areas (such as area 1456) should be identified as obstructions.

Example 15

FIG. 15 illustrates a representative illuminator 1500 that includes one or more light emitters such as LED 1502 that couple light into an edge of a transparent sheet 1504 that serves as a light guide. Coordinates axes 1550 indicate a Z-axis associated with a charged particle beam optical axis and a Y-axis associated with an axis of an optical system used to obtain 2D profiles. A major surface of the sheet 1504 is optically roughen by grinding, sanding, bead blasting or other processes to scatter light for illumination. As light introduced at an edge 1506 propagates toward an opposing edge 1507, the light is attenuated by scattering. To permit uniform illumination, zones 1510-1514 of the surface of the sheet 1504 can be provided with increasing roughness to increase scattering to compensate for loss in light intensity as light propagates from the LED 1502 to the edge 1507. Roughness or other scattering characteristic can change smoothly or stepwise (as shown) or both. Intensity of output light can be further customized as well with an illumination gradient from top to bottom (stepwise or continuous) so that, for example, a top edge and a bottom edge of the illuminator surface are associated with different intensities. Variable (stepped or gradient attenuators) can also be used having higher optical densities near the edge 1506 and lower optical densities near the edge 1507. Other illumination patterns can be used in addition to stepped or continuous gradients.

Example 16

Figure 16:
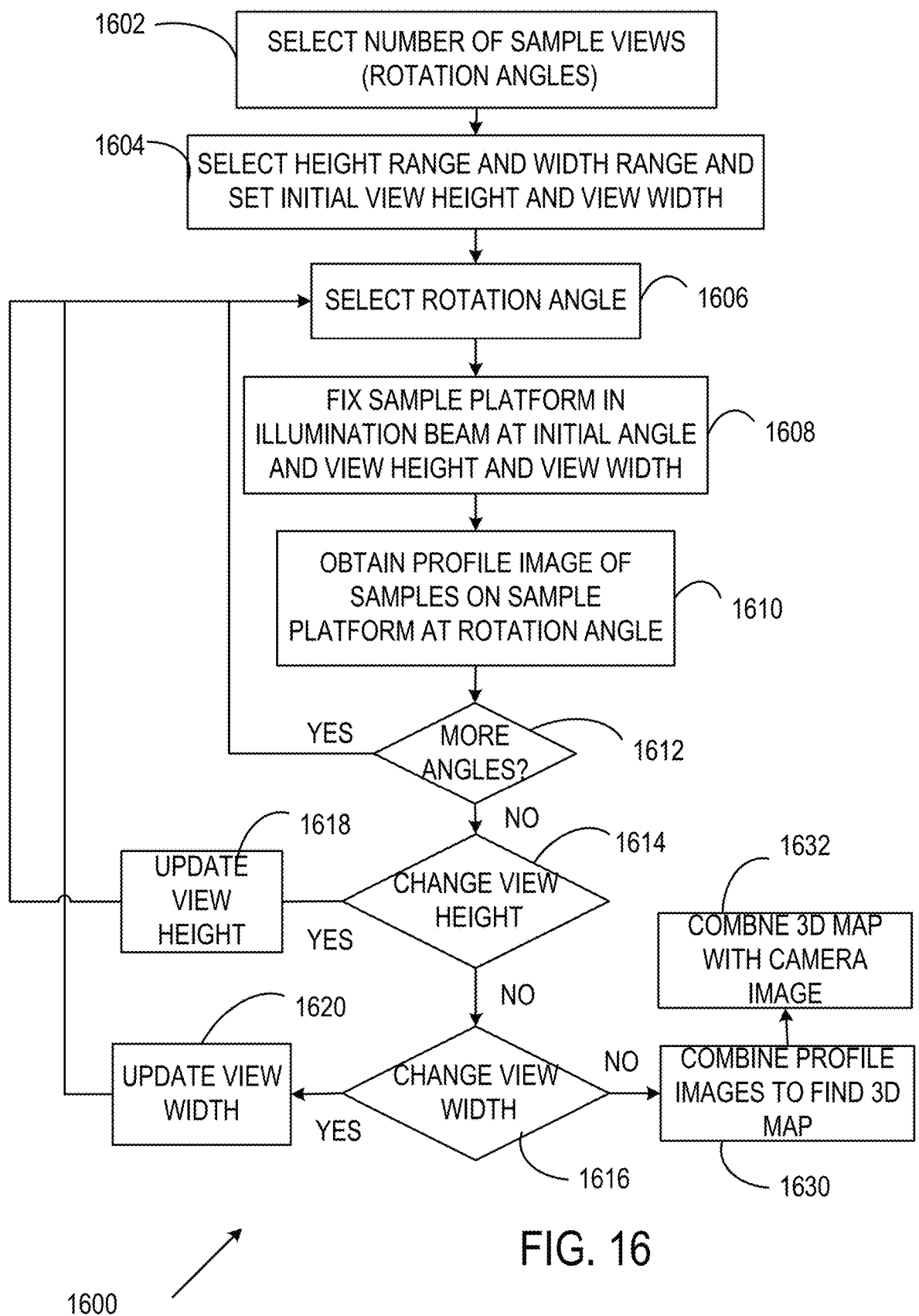
FIG. 16 illustrates a representative method of producing a 3D map.

Referring to FIG. 16, a representative method 1600 of producing a 3D map comprises selecting a number of sample views (rotation angles) at 1602 and selecting an initial view height and view width at 1604. In some cases, optical system field of view is not large enough to obtain a complete profile and the sample platform or optical system is adjusted to capture full specimen height. At 1606, a rotation angle is selected and at 1608, the sample platform is set at the initial height and rotation angle. At 1610, a 2D profile is obtained. In some examples, the 2D profile or 2D projection, is an image with binary contrast. The binary 2D profile may be converted by thresholding the image detected by the detector. For example, the 2D profile exhibits a first intensity corresponding to light directly received from the light source, without being blocked by the samples and/or the sample platform. The binary 2D profile can also exhibit a second intensity, less than the first intensity in areas corresponding to shadows generated by the light obstruction samples. At 1612, it is determined in additional angles are to be used to obtain additional profiles. If so, the method 1600 returns to 1606 to select a rotation angle and the necessary steps repeated. At 1614, it is determined if view height is to be adjusted. If so, view height is adjusted at 1618 and processing returns to 1606. View width can be changed at 1620 as determined at 1616 and processing can return to 1606. Once all profiles are available, the profiles can be combined at 1630 to produce a 3D map. The 3D map may be produced as illustrated below with reference to FIG. 24. If desired, the 3D map can optionally be combined with a camera image, such as the image acquired with the navigational camera, at 1632. Method 1600 may be executed after loading the samples into the vacuum chamber and before being imaged or processed with the charged particle beams. In one example, method 1600 may be executed while pumping down the vacuum chamber for charged particle beam imaging or processing. The 3D sample profile may be generated when the samples or the sample platform is positioned in a profiling location. The sample platform is then moved from the profiling location to a sample imaging location for imaging or processing one or more samples held by the sample platform. The sample platform is moved based on the 3D sample profile from the profiling location to the imaging location to avoid sample collision with internal structures of the CPM.

Example 17

Figure 17:
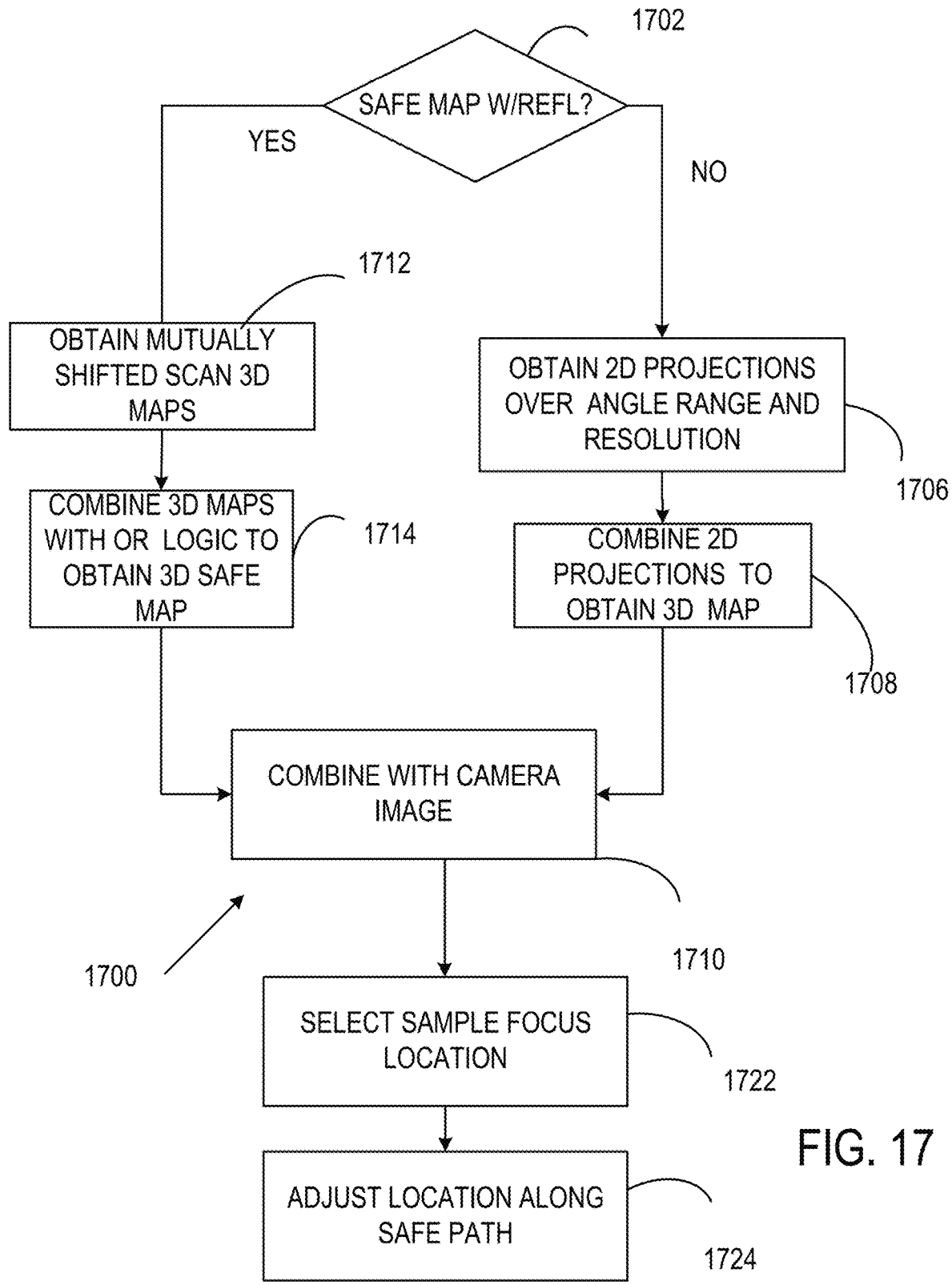
FIG. 17 illustrates a representative method of producing a 3D map and moving a sample platform to a microscope axis for imaging based on the 3D map.

FIG. 17, a representative method 1700 includes determining if a 3D map to accommodate reflections is to be obtained at 1702. Such a 3D map is referred to herein as a "safe" 3D map. The safe 3D map may be generated for high reflectivity samples with surfaces orientated in ways that may cause light reflection. As discussed above, a 3D map defines regions about a pole piece or other components within a vacuum chamber in which samples can travel to be situated for imaging or other evaluation without contacting other components. Reflective surfaces can be missed in mapping if they are sufficiently reflective to appear similar to direct illumination from a light source. Consideration of sample reflectivity can be needed in producing maps for reflective samples. If a safe map is to be produced, mutually shifted 3D maps are obtained at 1712 and combined at 1714 using OR logic to produce a safe 3D map. Shifted 3D maps are generally based on a number of angles that span a full rotation but with each map covering a different set of angles, for example, 0, 5, 10, . . . , 360 degrees and 1, 6, 11, . . . degrees, etc. Otherwise, 2D projections over a desired range and resolution (i.e., angle increment) are obtained at 1706 and combined to produce a 3D map at 1708. For non-reflective samples, the 3D map permits safe movement without consideration of reflections. The 3D map however produced (i.e., whether or not a safe 3D map) can optionally be combined with a camera image at 1710. At 1722, a sample location can be selected, and at 1724, the selected location can be situated for focusing using the 3D map. For example, the sample platform or other mechanical or electron optical components can be moved without operator intervention by moving within unoccupied regions in the 3D map, so that the selected focus location is at the imaging location, aligned with the CP beam under the pole piece of the CPM, for imaging or processing. The 3D map thus permits determination of a safe path that avoids collisions among samples and optical components.

A system controller such us such as a control computer can be operable to automatically check and control sample positioning using the full 3D map or to guide manual operation by sounding alarms or disabling sample movement into regions in which collisions are likely.

It will be appreciated that generation of the 3D map can be done outside of an electron microscope chamber or during or after microscope pump down. Sample locations can be indicated using a visual interface such as shown in FIG. 2. In some cases, 3D maps can be processed to remove areas that otherwise appear occupied by samples.

Example 18

Figure 18:
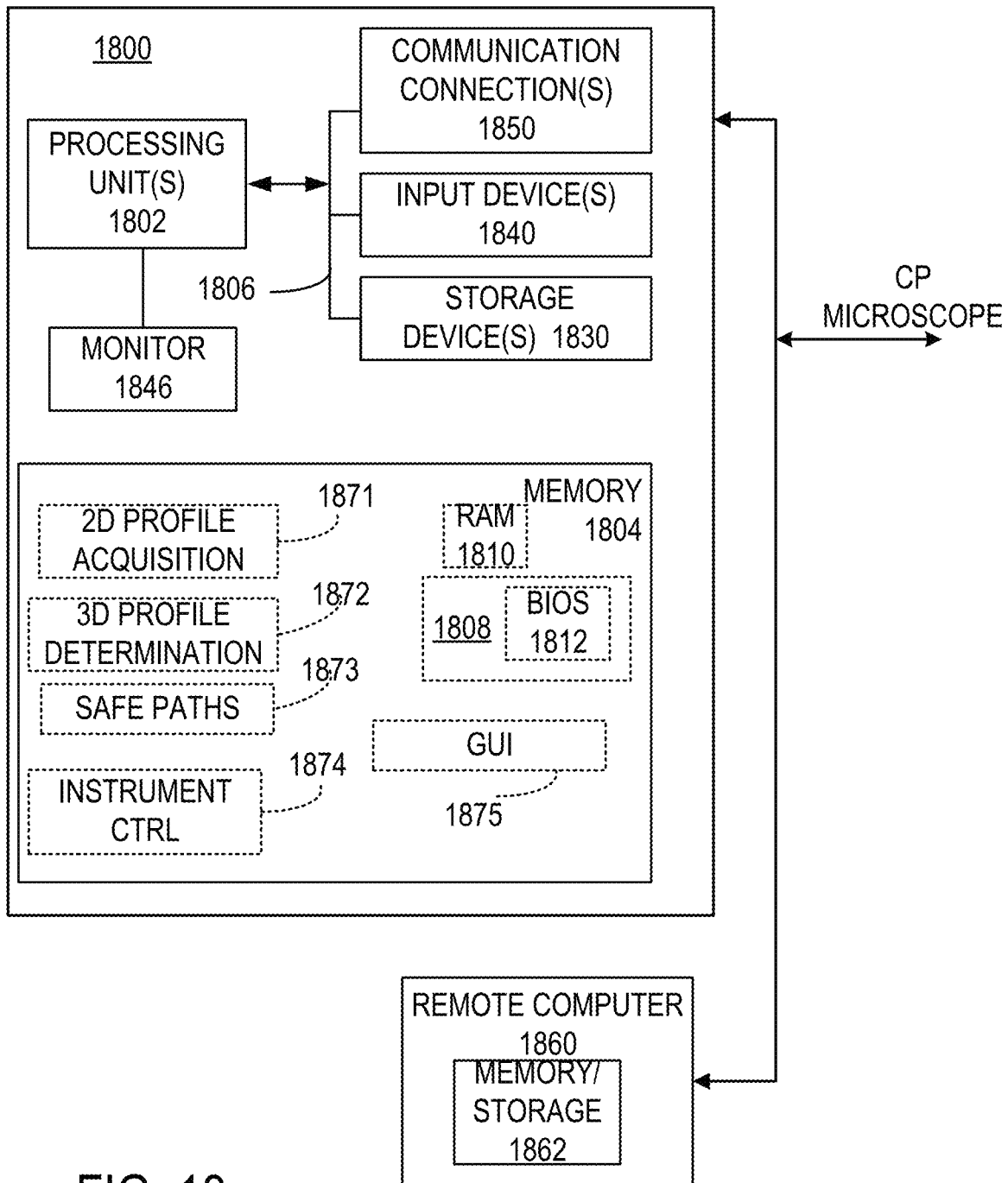
FIG. 18 illustrates a representative processing environment for the disclosed methods and apparatus.

With reference to FIG. 18, an exemplary system for implementing the disclosed technology includes a general purpose computing device in the form of an exemplary conventional PC 1800, including one or more processing units 1802, a system memory 1804, and a system bus 1806 that couples various system components including the system memory 1804 to the one or more processing units 1802. The system bus 1806 may be any of several types of bus structures including a memory bus or memory controller, a peripheral bus, and a local bus using any of a variety of bus architectures. The exemplary system memory 1804 includes read only memory (ROM) 1808 and random access memory (RAM) 1810. A basic input/output system (BIOS) 1812, containing the basic routines that help with the transfer of information between elements within the PC 1800, is stored in ROM 1808. The memory 1804 also contains a portions 1871-1875 that include computer-executable instructions and data for 2D profile acquisition (including sample stage control), determination of 3D profiles based on the acquired 2D profiles determination of safe sample paths, graphical user interfaces for operator inputs and outputs, and instrument control generally.

The exemplary PC 1800 further includes one or more storage devices 1830 such as a hard disk drive or a memory device such as a thumb drive. Such storage devices can be connected to the system bus 1806 by a suitable interface. Such computer-readable media provide nonvolatile storage of computer-readable instructions, data structures, program modules, and other data for the PC 1800. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1830 including an operating system, one or more application programs, other program modules, and program data. A user may enter commands and information into the PC 1800 through one or more input devices 1840 such as a keyboard and a pointing device such as a mouse, touch pad, digital camera, microphone, joystick, game pad, or the like. These and other input devices are often connected to the one or more processing units 1802 through a serial port interface that is coupled to the system bus 1806, but may be connected by other interfaces such as a parallel port, game port, or universal serial bus (USB). A monitor 1846 or other type of display device is also connected to the system bus 1806 via an interface, such as a video adapter. Other peripheral output devices, such as speakers and printers (not shown), may be included.

The PC 1800 may operate in a networked environment using logical connections to one or more remote computers, such as a remote computer 1860. In some examples, one or more network or communication connections 1850 are included. The remote computer 1860 may be another PC, a server, a router, a network PC, or a peer device or other common network node, and typically includes many or all of the elements described above relative to the PC 1800, although only a memory storage device 1862 has been illustrated in FIG. 18. The personal computer 1800 and/or the remote computer 1860 can be connected to a logical a local area network (LAN) and a wide area network (WAN). Such networking environments are commonplace in offices, enterprise-wide computer networks, intranets, and the Internet.

When used in a LAN networking environment, the PC 1800 is connected to the LAN through a network interface. When used in a WAN networking environment, the PC 1800 typically includes a modem or other means for establishing communications over the WAN, such as the Internet. In a networked environment, program modules depicted relative to the personal computer 1800, or portions thereof, may be stored in the remote memory storage device or other locations on the LAN or WAN. The network connections shown are exemplary, and other means of establishing a communications link between the computers may be used.

Example 19

Figure 19:
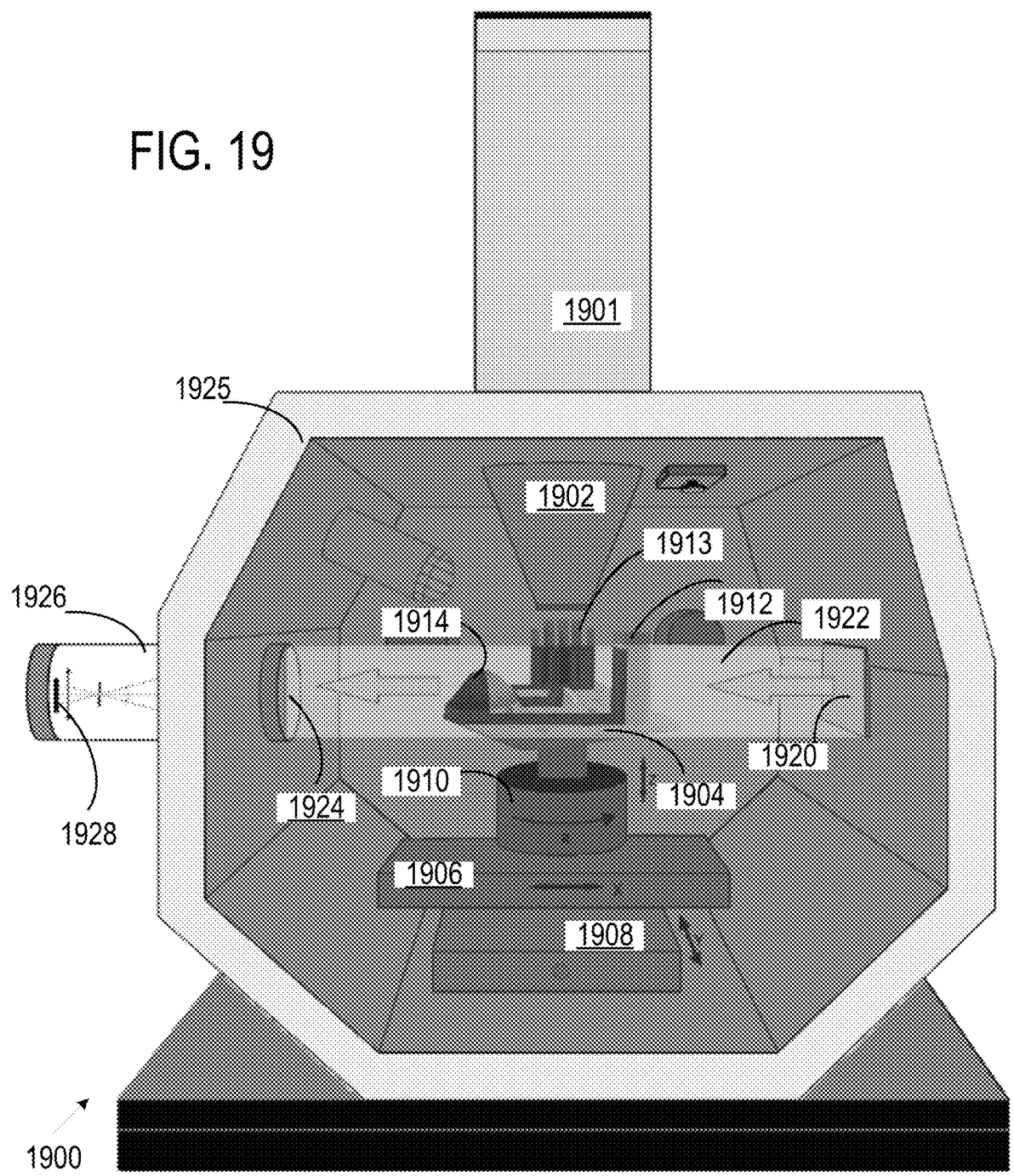
FIG. 19 is a sectional view of a representative electron microscope.

Referring to FIG. 19, a representative electron microscope 1900 includes a pole piece 1902 that directs a beam to a sample platform 1904 that is coupled to translation stages 1906, 1908 and a translation/rotation stage 1910. An electron optical column 1901 includes lenses, deflectors, and other electron optical components that that are not shown. Representative samples 1912-1914 are secured to the sample platform 1904.

An illuminator 1920 directs a beam 1922 toward the samples 1912-1914 and a transparent window 1924 in a vacuum chamber housing 1925. A telecentric optical system 1926 is situated to form profile images on an image sensor 1928 based on back-side illumination of the samples 1912-1914 for various rotation angles provided by the translation/rotation stage 1910.

Example 20

Figure 20:
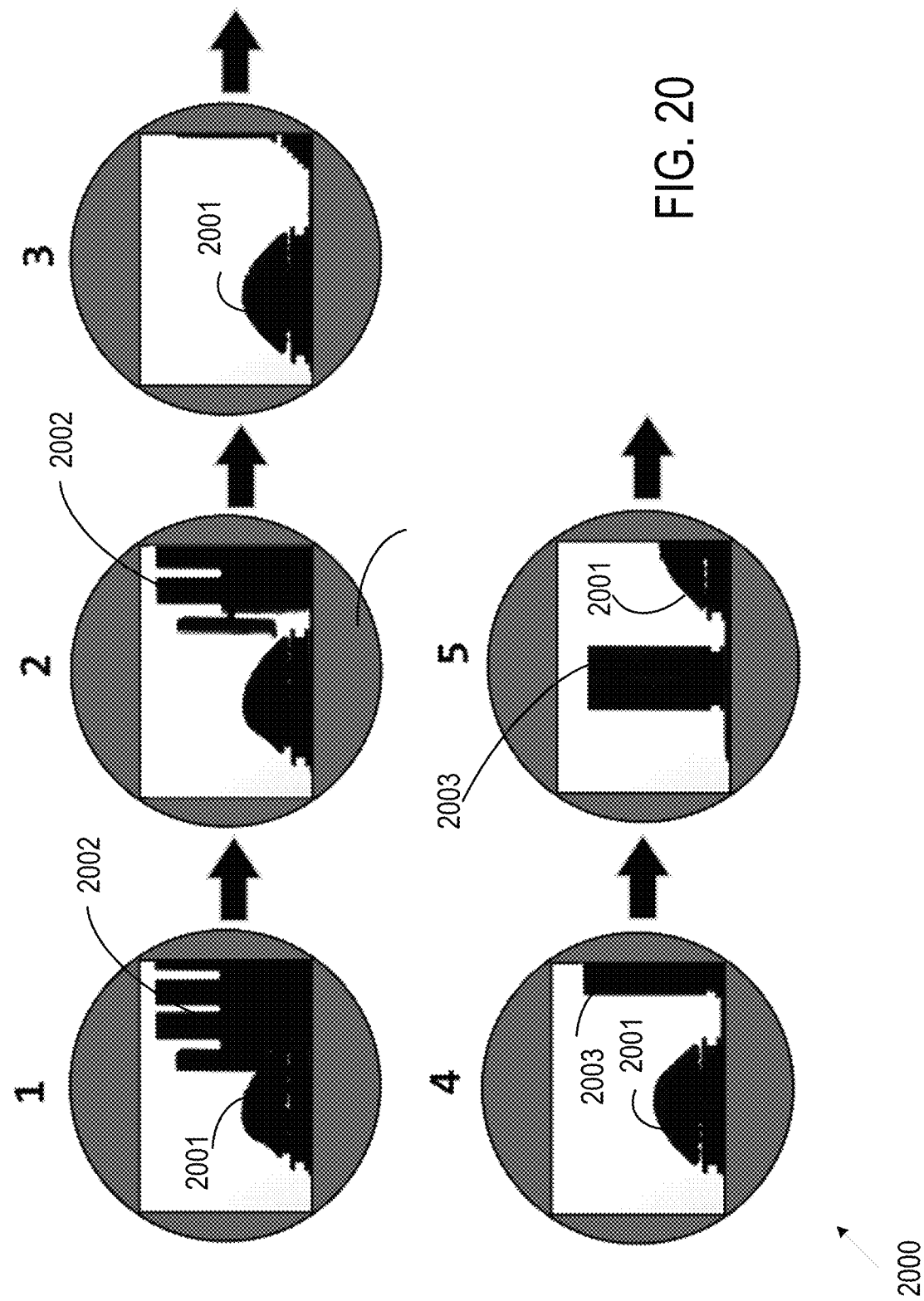
FIG. 20 illustrates 2D projections.

FIG. 20 illustrates a sequence 2000 of profile images obtained during rotation of a sample use to produce a 3D map such as the 3D map 350 of FIG. 3B. Representative samples 2001-2003 are shown. Each profile image corresponds to a different rotation angle.

FIGS. 21A-21B illustrate an example 2D projection 2100 of samples 2102, 2104 secured to a sample platform 2106. FIG. 21B illustrates a reflective area 2107 associated with an edge of the sample platform 2106. For safe movement within a vacuum chamber, the reflective area 2107 should be identified as an obstruction although it does not appear as dark as the remainder of the 2D projection of the sample platform 2106. Reflective areas such as the reflective area 2107 typically appear at selected rotation angles and in the associated 2D projections.

FIGS. 22A-22B illustrate 2D projections 2200, 2202 showing a sample 2201 and obtained using a telecentric optical system having a field of view smaller than the sample platform. The 2D projections 2202, 2204 can be combined to produce a full 2D profile 2206 in FIG. 22C.

Figure 23:
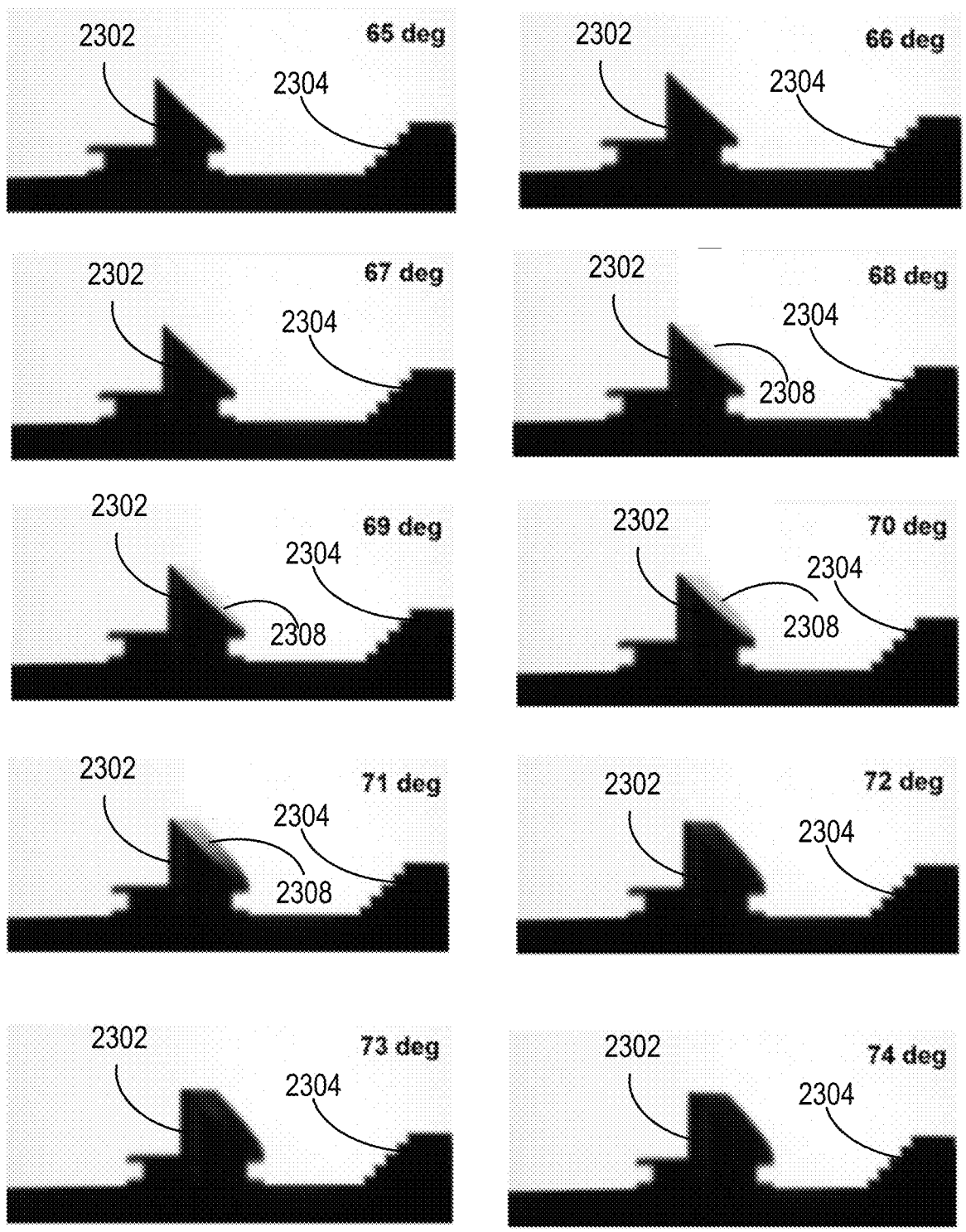
FIG. 23 illustrates a series of 2D projections at various rotation angles.

FIG. 23 illustrates a sequence of 2D projections obtained at different rotation angles. Representative samples 2302, 2304 are illustrated. At rotation angles of 68, 69, 70, and 71 degrees, the sample 2302 has a reflective area 2308 which can be identified as an obstruction in 3D mapping. The reflective area 2308 appears with an intensity similar to that of unobstructed areas. Such areas can be identified properly as obstructions if 2D projection values are subject to thresholding with a suitable value that distinguishes reflections from unobstructed areas. Reflections can be reduced with collimated illumination or increasing a distance between a light source and samples. Alternatively, patterned illumination can be used to simplify identification of reflective areas or the approach discussed above with reference to FIGS. 4A-4B can be used.

Example 21

Figure 24A:
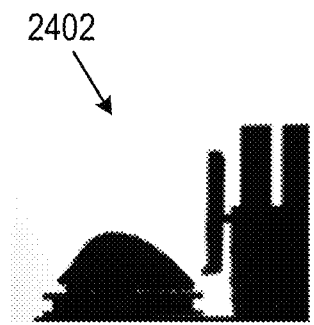
FIGS. 24A-24F illustrate methods of producing a 3D map from 2D projections.
Figure 24B:
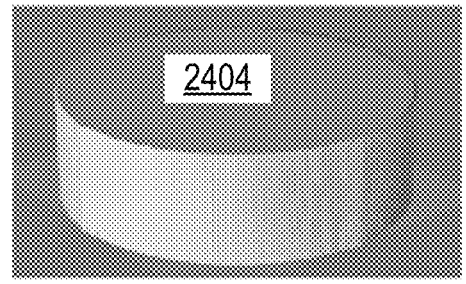
Figure 24C:
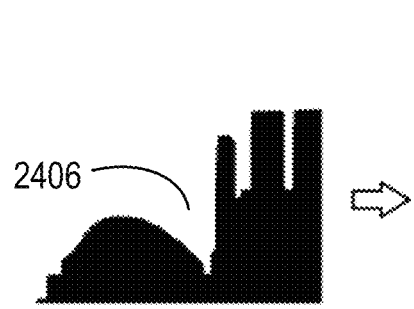
Figure 24D:
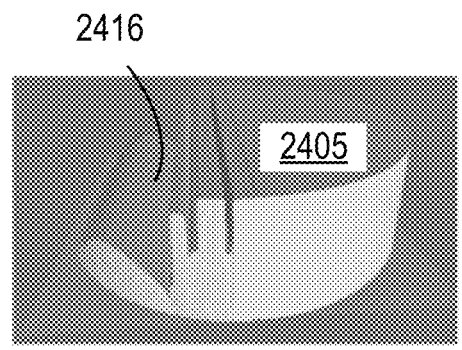
Figure 24E:
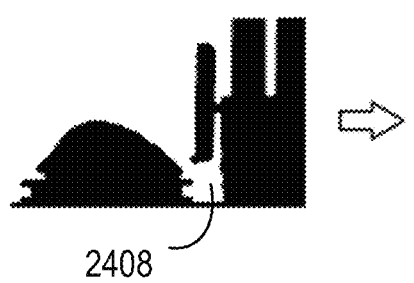
Figure 24F:
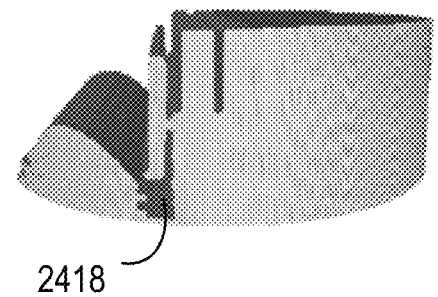

FIGS. 24A-24E illustrate processing of 2D profiles to produce a 3D map. FIG. 24A shows a representative 2D projection 2402 at a selected angle and FIG. 24B shows a cylindrical volume 2404 indicating an initial, fully occupied sample space, i.e., a space that is potentially available for movement but can include portions that are occupied by samples and are thus not safe for movement. As shown in FIG. 24B, the initial size of the cylindrical volume 2404 is based on a size of the sample holder and microscope configuration and indicates a maximum volume in which samples can be positioned. Using the 2D projection 2402, portions of the cylindrical volume 2404 are removed as shown in FIG. 24D and FIG. 24F. As shown in FIG. 24C, an unoccupied space 2406 in the 2D projection 2402 is used to define a corresponding feature 2416 indicating a region in which movement can be permitted. The unoccupied space 2406 is extended through the cylindrical volume 24D to remove portions of the cylindrical volume 2404 so that the feature 2416 extends through the cylindrical volume 2404. Other unoccupied spaces indicated by the 2D projection 2402 define corresponding features and are extended through the cylindrical volume 2404. A resulting volume 2405 (FIG. 24D) indicates safe areas for movement. In this example, the upper borders of the 2D projection 2402 are used and this approach can be referred to as an "envelope" approach. Additional 2D projections at other rotation angles are then used to define features in the cylindrical volume 2404 to produce a 3D map. Alternatively, full 2D projection data can be used as shown in FIGS. 24E-24F. In this case, a lower unoccupied space 2408 in the 2D projection 2402 is used to define a corresponding feature 2418 in the volume 2404. Additional 2D projections at other angles are then used to define features in the volume 2404 to produce a 3D map. This approach can be more computationally intensive than the envelope approach.

In view of the many possible embodiments to which the principles of the disclosed technology may be applied, it should be recognized that the illustrated embodiments are only preferred examples and should not be taken as limiting in scope. I therefore claim as all that comes within the scope and spirit of the appended claims.

I claim:

1. A method, comprising:
   illuminating a sample situated within a vacuum chamber of a charged-particle microscope from a first side;
   detecting at least one 2D projection of the sample on a second side, opposite the first side;
   generating a 3D map based on the at least one 2D projection; and
   situating the sample at an imaging location within the vacuum chamber based on the 3D map.

2. The method of claim 1, wherein the sample is illuminated from the first side with a light source, and the sample is imaged or processed with a charged particle beam at the imaging location.

3. The method of claim 1, further comprising detecting a plurality of 2D projections of the sample on the second side by rotating the sample, wherein the 3D map is generated based on the plurality of 2D projections.

4. The method of claim 3, further comprising determining a set of initial 3D maps, wherein each of the initial 3D maps is based on a different set of rotation angles and the 3D map is based on combining the initial 3D maps so that the 3D map is a safe 3D map.

5. The method of claim 1, wherein the sample is illuminated at a profiling location, and the sample is moved from the profiling location to the imaging location based on the 3D map.

6. The method of claim 1, wherein the illuminating the sample comprises directing a collimated beam to the sample.

7. The method of claim 1, wherein the illuminating the sample is performed with an illumination source situated within the vacuum chamber.

8. The method of claim 1, wherein the illuminating the sample comprises illuminating the sample with beam having a patterned intensity.

9. The method of claim 1, wherein the detecting at least one 2D projection of the sample on a second side, opposite the first side is performed with a telecentric optical system.

10. The method of claim 9, wherein a central axis of the telecentric optical system is parallel to a sample platform holding the sample when the sample is illuminated.

11. The method of claim 10, wherein the telecentric optical system includes an objective lens that is situated within a vacuum chamber or in a wall of the vacuum chamber.

12. The method of claim 11, wherein the telecentric optical system is object-side telecentric.

13. The method of claim 11, wherein the telecentric optical system is object-side telecentric and image-side telecentric.

14. A computer-readable medium storing processor executable instructions for the method of claim 1.

15. A charged particle microscope, comprising:
- an illumination system situated to illuminate samples with light from a first side;
- an imaging system situated to produce 2D projections of the illuminated samples based on the illumination from the first side; and
- a processor coupled to receive the 2D projections and generate a 3D map of the samples.

16. The charged particle microscope of claim 15, wherein the imaging system includes an image sensor situated on the second side, opposite the first side, to produce 2D profile images of the illuminated samples, and the processor is coupled to a sample platform and configured to rotate the samples to produce the 2D projections.

17. The charged particle microscope of claim 16, wherein the illumination system is situated to direct a diffuse beam to the samples, and the imaging system includes a telecentric optical system that directs 2D projections to the image sensor.

18. The charged particle microscope of claim 15, wherein the illumination system is situated to direct a collimated beam to the samples.

19. The charged particle microscope of claim 15, further comprising a sample stage operable to move a sample platform that retains the samples to a charged particle optical axis.

20. The charged particle microscope of claim 15, wherein the processor is coupled to initiate evacuation of a charged particle microscope vacuum chamber during acquisition of the 2D projections.

\* \* \* \* \*